United States Patent
Yamamoto

(10) Patent No.: US 7,732,349 B2
(45) Date of Patent: Jun. 8, 2010

(54) MANUFACTURING METHOD OF INSULATING FILM AND SEMICONDUCTOR DEVICE

(75) Inventor: Hiroko Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 505 days.

(21) Appl. No.: 11/283,812

(22) Filed: Nov. 22, 2005

(65) Prior Publication Data

US 2006/0116000 A1  Jun. 1, 2006

(30) Foreign Application Priority Data

Nov. 30, 2004  (JP) .............................. 2004-347738

(51) Int. Cl.
  *H01L 21/31* (2006.01)
  *H01L 21/324* (2006.01)

(52) U.S. Cl. .................. 438/783; 438/622; 438/637; 438/662; 438/795; 257/E21.174; 257/E21.273; 257/E21.581

(58) Field of Classification Search ................. 438/622, 438/637, 662, 758, 795, 783
See application file for complete search history.

(56) References Cited

U.S. PATENT DOCUMENTS

| | | | |
|---|---|---|---|
| 6,309,957 B1 | 10/2001 | Tu et al. | |
| 6,376,353 B1 | 4/2002 | Zhou et al. | |
| 6,399,486 B1 | 6/2002 | Chen et al. | |
| 6,429,118 B1 | 8/2002 | Chen et al. | |
| 6,492,708 B2 | 12/2002 | Acosta et al. | |
| 6,514,855 B1 | 2/2003 | Suzuki et al. | |
| 6,720,230 B2 | 4/2004 | Acosta et al. | |
| 6,753,249 B1 | 6/2004 | Chen et al. | |
| 6,897,433 B2 | 5/2005 | Itoh et al. | |
| 6,946,381 B2 | 9/2005 | Hwang | |
| 7,356,921 B2 * | 4/2008 | Furusawa et al. | 29/846 |
| 7,404,990 B2 | 7/2008 | Lukas et al. | |
| 2002/0130386 A1 | 9/2002 | Acosta et al. | |
| 2004/0096593 A1 | 5/2004 | Lukas et al. | |
| 2004/0137241 A1 * | 7/2004 | Lin et al. | 428/447 |

(Continued)

FOREIGN PATENT DOCUMENTS

CN  1452213 A  10/2003

(Continued)

OTHER PUBLICATIONS

Nikkei Microdevices, Nov. 2004, No. 233, pp. 58-65.

(Continued)

*Primary Examiner*—Alexander G Ghyka
(74) *Attorney, Agent, or Firm*—Nixon Peabody LLP; Jeffrey L. Costellia

(57) ABSTRACT

The invention provides a manufacturing method of an insulating film having a plurality of pores, as well as a manufacturing method of a highly integrated semiconductor device with high yield. According to the invention, a porous insulating film is formed by forming a plurality of pores in an interlayer insulating film using a laser beam, which results in lower dielectric constant of the interlayer insulating film. In addition, a composition containing conductive particles is discharged onto the porous insulating film by a droplet discharge method typified by an ink jet printing method, and then baked to form a wire. As the laser beam, an ultrashort pulse laser beam is preferably used.

19 Claims, 26 Drawing Sheets

U.S. PATENT DOCUMENTS

| | | |
|---|---|---|
| 2005/0127035 A1* | 6/2005 | Ling .......................... 216/56 |
| 2005/0191847 A1 | 9/2005 | Misawa et al. |
| 2006/0102937 A1* | 5/2006 | Maruyama et al. .......... 257/275 |
| 2006/0113671 A1 | 6/2006 | Isa et al. |
| 2006/0115983 A1 | 6/2006 | Fujii et al. |

FOREIGN PATENT DOCUMENTS

| | | |
|---|---|---|
| EP | 1 420 439 A2 | 5/2004 |
| JP | 2001-332092 | 11/2001 |

OTHER PUBLICATIONS

Notification of the First Office Action dated Sep. 5, 2008 in Chinese Counterpart Application No. 200510129035.6, with English translation.

* cited by examiner

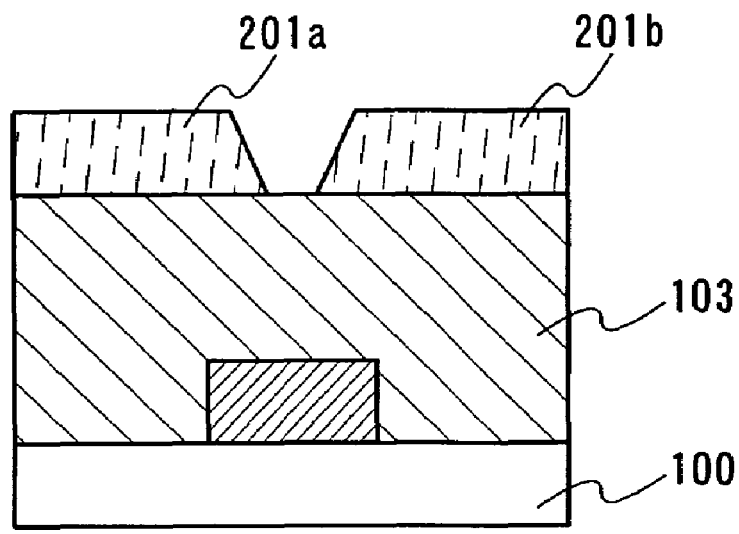
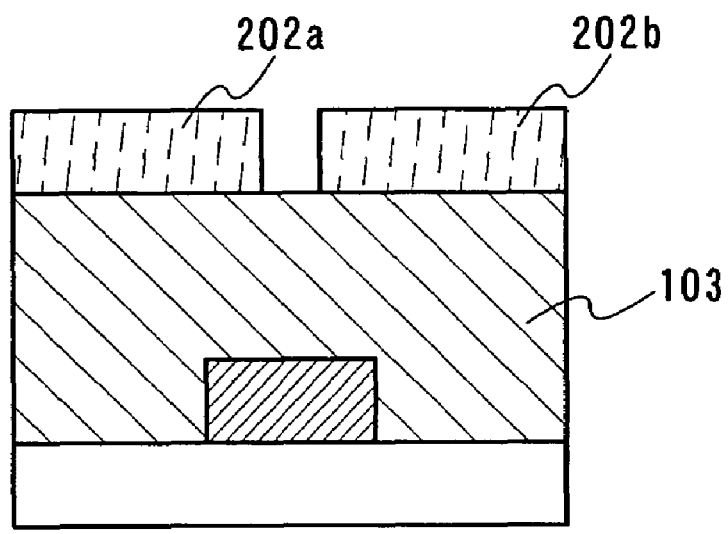
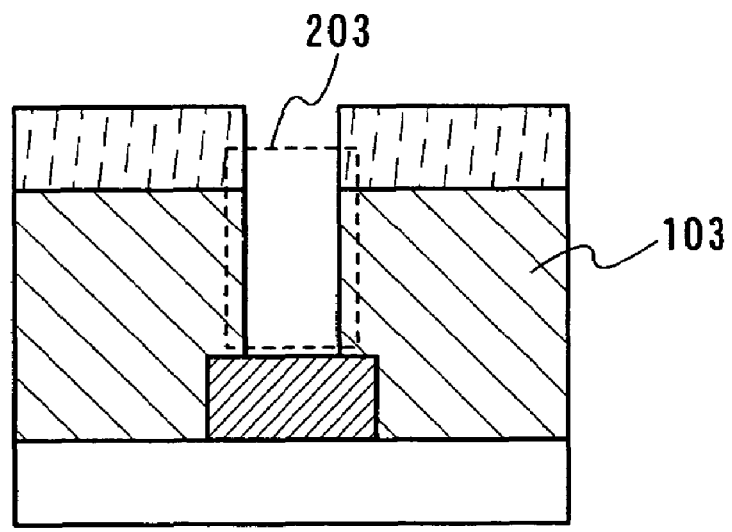

1001 : laser beam direct writing system
1002 : personal computer
1003 : laser oscillator
1004 : power supply
1005 : optical system
1006 : acousto-optic modulator
1007 : optical system
1008 : substrate
1009 : substrate moving mechanism
1010 : D/A converter portion
1011 : driver
1012 : driver

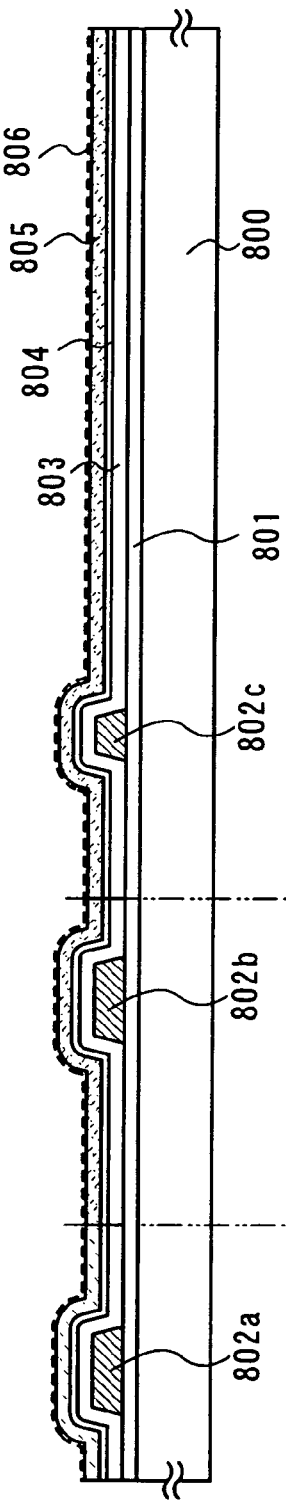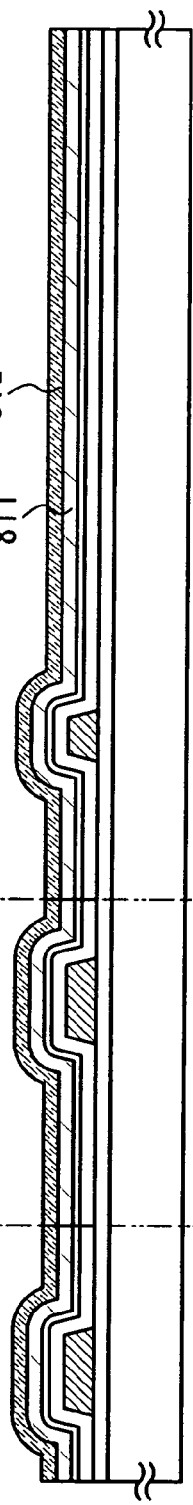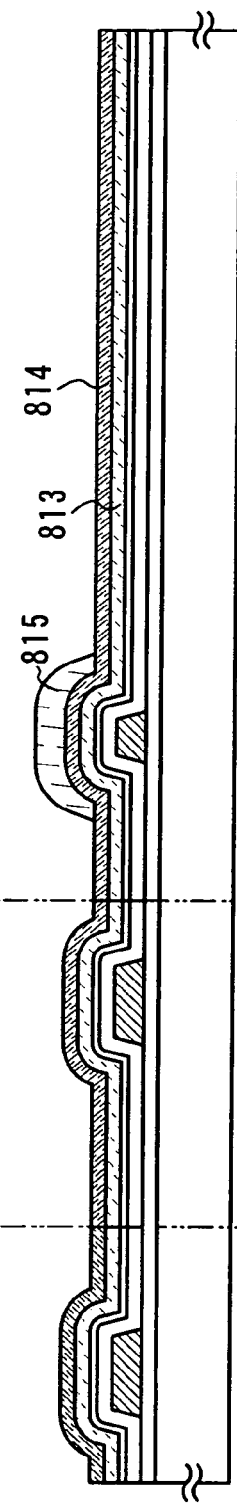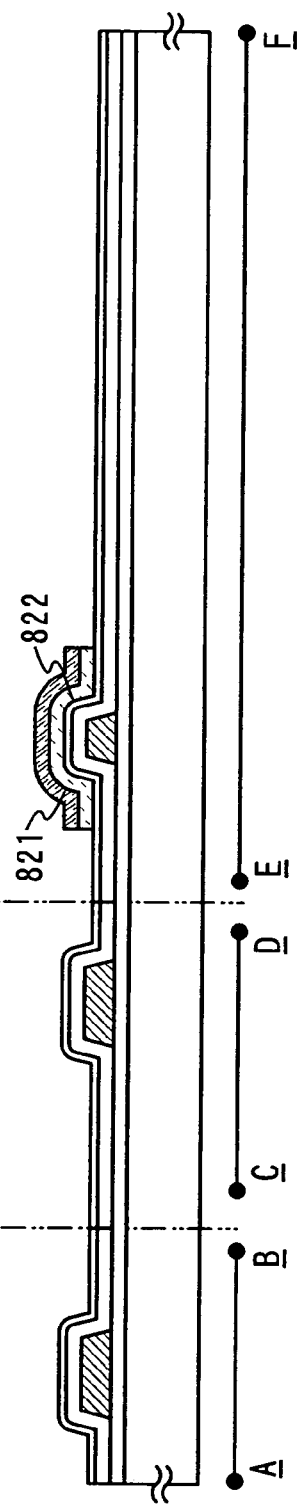
FIG. 11A
FIG. 11B
FIG. 11C
FIG. 11D

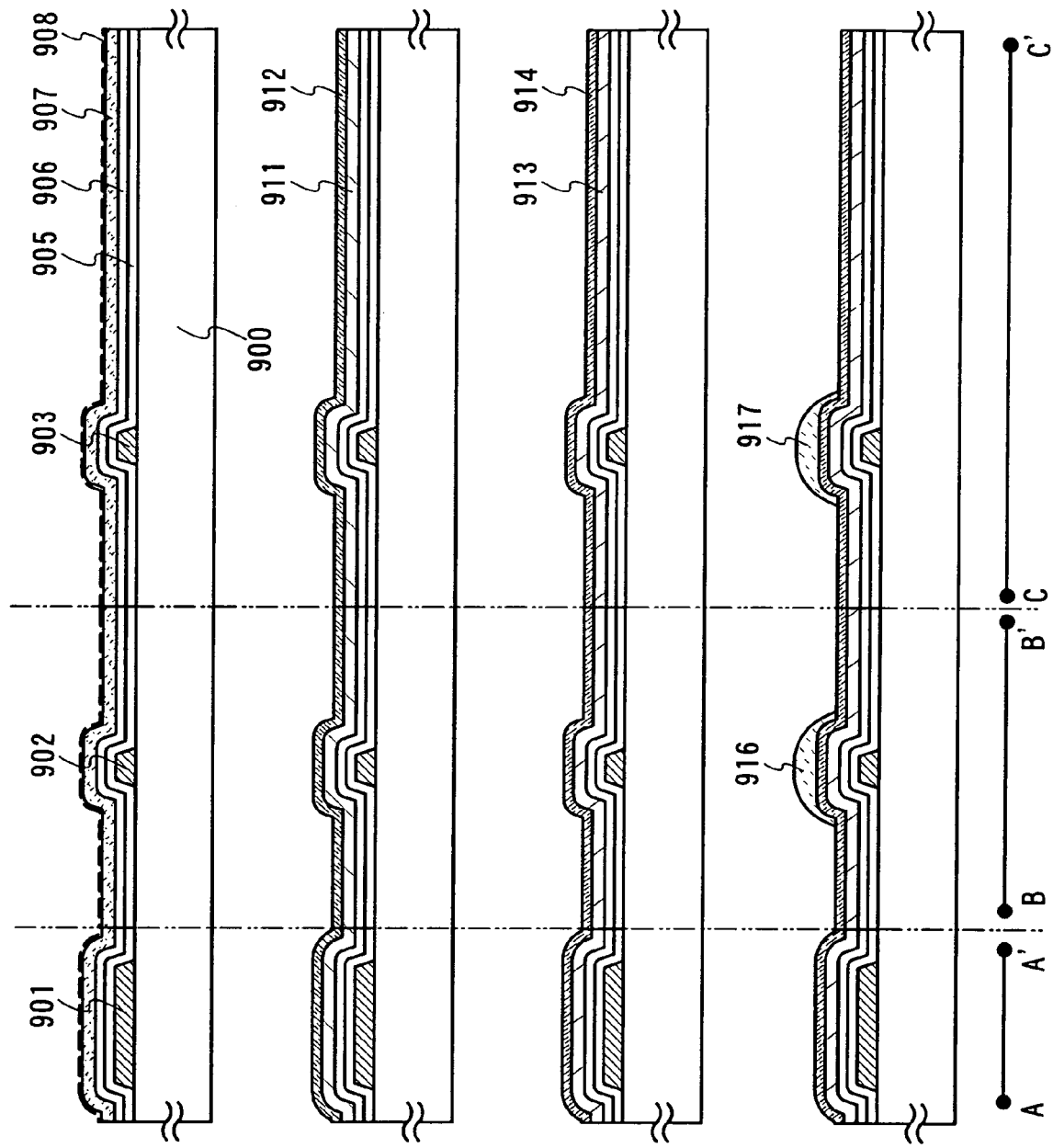

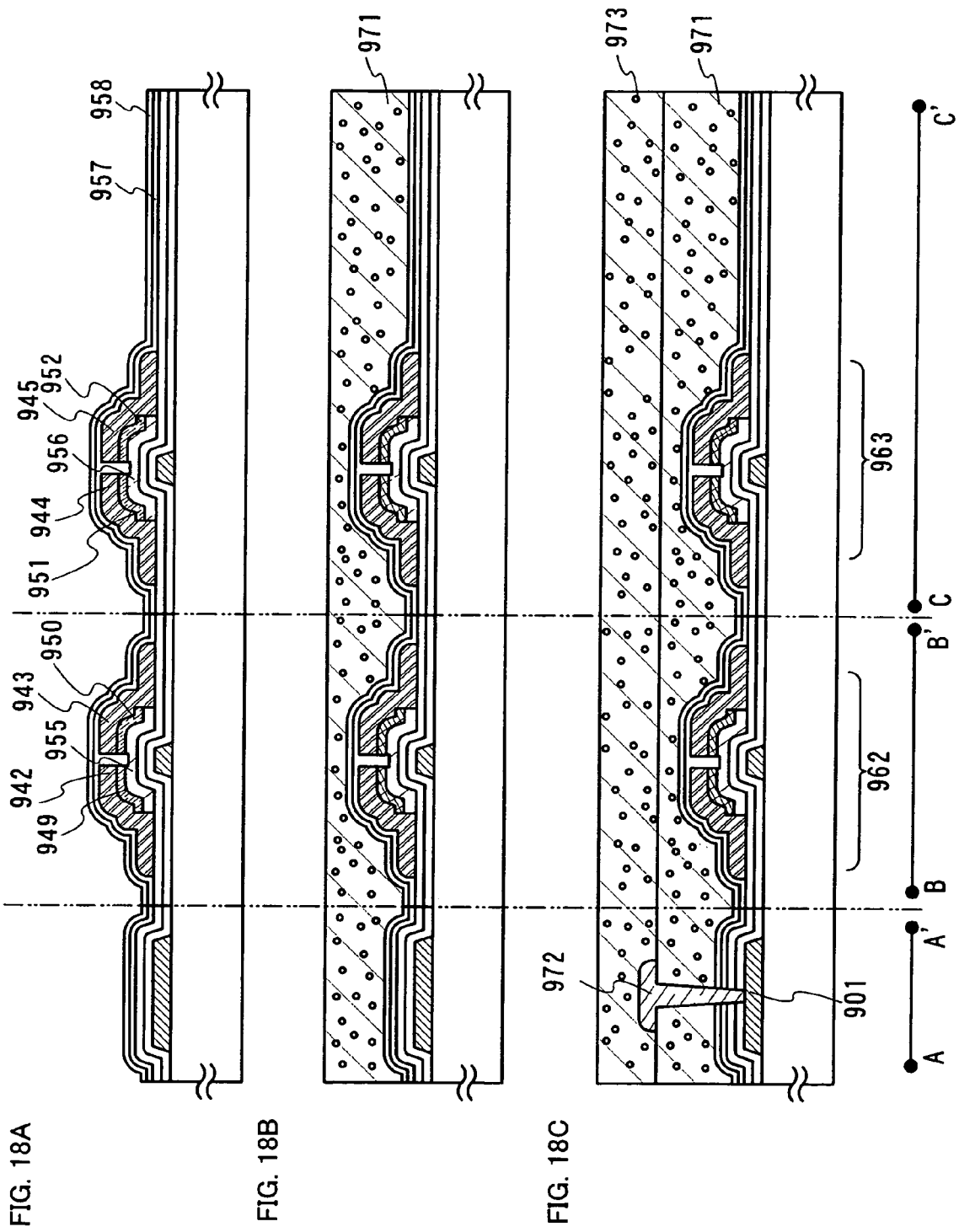

MANUFACTURING METHOD OF INSULATING FILM AND SEMICONDUCTOR DEVICE

BACKGROUND OF THE INVENTION

1. Field of the Invention

The present invention relates to a manufacturing method of a porous insulating film by use of a laser, and a manufacturing method of a semiconductor device having a wiring board and a semiconductor element by use of a droplet discharge method typified by an ink jet printing method.

2. Description of the Related Art

In recent years, the thickness of a film constituting each part of a semiconductor element has been reduced for high integration of LSI (Large Scale Integrated circuit), and thus signal delay between multilayers has interfered with high speed operation. Since the signal delay depends on wire resistance and wire capacitance, a higher performance LSI requires a wiring material with a lower resistance and an interlayer insulating film material with a lower dielectric constant.

In order to reduce the resistance of a wire, a copper (Cu) wire having a lower resistance has been properly studied instead of a conventional aluminum (Al) wire, and a wiring process has been performed by a Cu damascene method instead of a conventional Al gap fill method. In the Cu damascene method, a CMP (Chemical Mechanical Polishing) process is used, where excess Cu formed over a Cu wire is polished and removed by use of slurry and a pad while applying load to a substrate.

Meanwhile, in order to reduce wire capacitance, an organic material and an inorganic material that have a lower dielectric constant have been actively proposed and studied instead of a conventional silicon oxide ($SiO_2$) film. Low polarizability and density are considered to be necessary for reduction in relative dielectric constant of an interlayer insulating film.

An organic material has a lower polarizability per unit volume than a silicon oxide film; therefore, it has a lower relative dielectric constant. It is thus suggested that an organic material or a hybrid material of siloxane and an organic molecule is used to reduce the relative dielectric constant of an interlayer insulating film. It is also suggested that perfluorocarbon polymer having a C—F bond (such as poly-tetrafluoroethylene) is used to reduce the relative dielectric constant of an interlayer insulating film, since this material has the smallest polarizability (see Non-Patent Document 1, for example).

In addition, a low density film, namely, a porous film has been studied to reduce the relative dielectric constant. The use of a porous film attracts attention as a method of achieving a relative dielectric constant of 2 or less.

The aforementioned interlayer insulating film with a low relative dielectric constant is manufactured by plasma CVD, spin coating or the like.

[Non-Patent Document 1] Nikkei Microdevices, Nikkei Business Publications, Inc., November 2004, pp. 58-65

SUMMARY OF THE INVENTION

However, the CMP process is used in the Cu damascene method, and stress such as pressure from above and shear stress is thus applied to an interlayer insulating film. Accordingly, there are problems in that the mechanical strength of the interlayer insulating film, which can withstand the CMP process, and the adhesiveness with top and bottom layers are reduced.

In addition, the Cu damascene method has a polishing step, and thus variations in polishing easily occur in manufacturing steps of a semiconductor element over a large substrate such as a display device. This causes problems such as a short circuit between wires, and variations in the thickness of wires, leading to difficulty in manufacturing semiconductor devices with high yield.

On the other hand, an insulating film having a plurality of pores (porous insulating film) has a plurality of pores inside the film; therefore, there are problems in etching and an interface state with dissimilar materials. Specifically, there is a possibility that an etching gas diffuses into an insulating film through pores and reacts in the insulating film when a contact hole is formed, leading to attachment of impurities and progress of etching in the insulating film. As a result, it is difficult to manufacture semiconductor devices with high yield.

In addition, since the mechanical strength of a porous insulating film is extremely low, it is difficult to achieve both of low dielectric constant and mechanical strength capable of withstanding the CMP process, which results in reduced yield.

Meanwhile, when a porous insulating film is formed by coating a substrate with a material containing molecules that evaporate by heat treatment and heating the substrate, pores with constant shape and size cannot be obtained. In addition, when a plurality of pores are connected to be a larger pore, problems occur, such as variations in film thickness distribution in the micro region. As a result, the relative dielectric constant of the interlayer insulating film is partially varied, leading to variations in the semiconductor device.

In view of the foregoing problems, the invention provides a new manufacturing method of an insulating film having a plurality of pores. The invention also provides a manufacturing method of a highly integrated semiconductor device with high yield.

According to the invention, a plurality of pores are formed in an insulating film using a laser beam, so that a porous insulating film is formed. Further, a composition containing conductive particles is discharged by a droplet discharge method typified by an ink jet printing method, and then baked to form a wire. An ultrashort pulse laser beam (hereinafter referred to as an fs laser) is preferably used as the laser beam.

According to the invention, an insulating film with a low dielectric constant can be obtained regardless of using an organic material or an inorganic material. In addition, it is possible to control the size, diameter, density, shape and the like of a plurality of pores in a porous insulating film. The forming position of the plurality of pores can also be controlled, so that the plurality of pores are not connected to each other and the insulating film with a constant density is obtained. Further, the plurality of pores can be formed after the CMP process, which solves the problem of reduced mechanical strength due to the plurality of pores.

Since pores are formed by laser irradiation, the pores can be arranged regularly or at random.

The density of pores can be changed partially. Accordingly, in an insulating film formed between multilayers, the density of pores can be increased to reduce the relative dielectric constant. At this time, the pores may be partially irradiated with a laser beam to increase density. Alternatively, after pores with a constant density are formed in the entire insulating film by laser irradiation under a first condition, the density of the pores may be partially increased by laser irradiation under a second condition.

Since the shape of pores can be controlled, spherical pores, or continuously connected pores can be formed.

According to one mode of the invention, a manufacturing method of an insulating film has the steps of forming a first insulating film over a substrate, and irradiating the first insulating film with a laser beam emitted from an ultrashort pulse laser to form a plurality of pores, whereby a porous insulating film is formed.

According to another mode of the invention, a manufacturing method of a semiconductor device has the steps of forming a first conductive film over a substrate, forming a first insulating film to cover the first conductive film, irradiating the first insulating film with a first laser beam emitted from an ultrashort pulse laser to form a plurality of pores and a porous insulating film, etching a part of the porous insulating film to expose the first conductive film and form a contact hole, discharging a liquid substance containing conductive particles into the contact hole by a droplet discharge method, and irradiating a part of the liquid substance containing the conductive particles with a second laser beam to form a second conductive film constituted by the conductive particles.

According to another mode of the invention, a manufacturing method of a semiconductor device has the steps of forming a first conductive film over a substrate, forming a first insulating film to cover the first conductive film, etching a part of the first insulating film to expose the first conductive film and form a contact hole, irradiating the first insulating film with a first laser beam emitted from an ultrashort pulse laser to form a plurality of pores and a porous insulating film, discharging a liquid substance containing conductive particles into the contact hole by a droplet discharge method, and irradiating a part of the liquid substance containing the conductive particles with a second laser beam to form a second conductive film constituted by the conductive particles.

Each of the plurality of pores has a diameter of 1 to 2000 nm.

The first insulating film is formed using a material that transmits the laser beam.

The second conductive film is formed of the conductive particles that overlap at random.

A semiconductor element having the insulating film of the invention includes a TFT, a field effect transistor (FET), a MOS transistor, a bipolar transistor, an organic semiconductor transistor, an MIM element, a memory element, a diode, a photoelectric converter, a capacitor, a resistor, and the like. The TFT includes a forward staggered TFT, a reversed staggered TFT (channel etched TFT or channel protective TFT), a coplanar bottom gate TFT, and a top gate TFT.

In the invention, the semiconductor device includes an integrated circuit, a display device, a wireless tag, an IC tag and the like, each of which is constituted by semiconductor elements. Typically, there are display devices such as a liquid crystal display device, a light emitting device, a DMD (Digital Micromirror Device), a PDP (Plasma Display Panel), an FED (Field Emission Display), and an electrophoretic display device (electronic paper).

In the invention, the display device means a device using a display element, namely, an image display device. The display device also includes a module where a display panel is provided with an FPC (Flexible Printed Circuit), a TAB (Tape Automated Bonding) tape, or a TCP (Tape Carrier Package), a module where a printed wiring board is attached to the end of a TAB tape or a TCP, and a module where an IC (Integrated Circuit) or a CPU is directly mounted on a display element by COG (Chip On Glass).

According to the invention, a porous insulating film having a plurality of pores can be formed as well as an insulating film with a low dielectric constant. Since a plurality of pores are formed in a non-porous insulating film in the invention, a plurality of pores can be formed in a non-porous insulating film after treatment such as a CMP step, thereby a porous insulating film can be obtained. Accordingly, differently from conventional porous insulating films, the insulating film can be prevented from being damaged due to the CMP step in manufacturing steps of a highly integrated semiconductor device.

A porous insulating film can be formed using an insulating film formed over a large size substrate; therefore, a display device can be obtained with high yield. In addition, since a porous insulating film has a low dielectric constant, parasitic capacitance between wires can be suppressed. Thus, the thickness of an interlayer insulating film can be reduced and the throughput of a display device can be improved.

Since a porous insulating film can be formed by forming a plurality of pores in an insulating film after forming a contact hole in a part of the insulating film, an etching gas can be prevented from entering and diffusing into the insulating film through the sidewall of the contact hole. As a result, a semiconductor device can be formed with high yield.

An insulating film with a uniform relative dielectric constant can be formed since it is possible to control the size, position, and density of a plurality of pores in a porous insulating film. Further, it is possible to prevent short circuit due to pores formed between wires, leading to a highly integrated circuit with high yield.

BRIEF DESCRIPTION OF THE DRAWINGS

FIGS. 2A to 2C are cross sectional views showing manufacturing steps of a semiconductor device in accordance with the invention.

FIGS. 11A to 11D are cross sectional views showing manufacturing steps of a semiconductor device in accordance with the invention.

FIGS. 16A to 16D are cross sectional views showing manufacturing steps of a semiconductor device in accordance with the invention.

FIGS. 18A to 18C are cross sectional views showing manufacturing steps of a semiconductor device in accordance with the invention.

DETAILED DESCRIPTION OF THE INVENTION

Figure 1A:
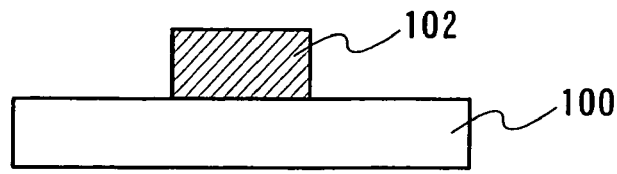
FIGS. 1A to 1E are cross sectional views showing manufacturing steps of a semiconductor device in accordance with the invention.

Although the invention will be fully described by way of Embodiment Modes and Embodiments with reference to the accompanying drawings, it is to be understood that various changes and modifications will be apparent to those skilled in the art. Therefore, unless such changes and modifications depart from the scope of the invention, they should be construed as being included therein. Note that in the following description of the invention, the same component is denoted by the same reference numeral in different drawings.

Embodiment Mode 1

Described in this embodiment mode are a manufacturing method of an insulating film having pores (also called voids) and a forming method of a metal wire without using a CMP step. That is, description is made on a method where pores are formed using an fs laser after forming an insulating film. Description is also made on a method of forming a metal wire by discharging a composition containing a conductive material by a droplet discharge method.

An embodiment mode of the invention is described with reference to FIG. 1A. This embodiment mode uses an insulating substrate 100 having elements such as transistors (not shown) formed by a common manufacturing process of a semiconductor device.

A metal wire 102 is formed over the insulating substrate 100. The metal wire 102 is obtained in the following manner. First, a metal film is formed by a known method such as printing, electroless deposition, electrolytic plating, PVD (Physical Vapor Deposition), CVD (Chemical Vapor Deposition), and vapor deposition. Then, using a common lithography technique, a resist pattern is formed on the metal film in an area where the metal wire is to be formed. Finally, the metal film is etched using the resist pattern as a mask, thereby the metal wire 102 is formed. The metal wire 102 may be formed using any of metals with a high melting point, such as tungsten (W), molybdenum (Mo), zirconium (Zr), hafnium (Hf), Vanadium (V), Niobium (Nb), tantalum (Ta), chromium (Cr), cobalt (Co), nickel (Ni), and platinum (Pt), or an alloy or a metal nitride of them. A plurality of layers of these materials may be stacked. Typically, a tantalum nitride (TaN) film and a tungsten film may be stacked in this order over the surface of the substrate. Alternatively, a conductive film may be formed using a material with a low melting point, such as aluminum (Al), silver (Ag), gold (Au), and copper (Cu). Instead, silicon added with an impurity element that imparts one conductivity type may be used. For example, an N-type silicon film where an impurity element imparting N-type conductivity, such as phosphorus (P) is added to an amorphous silicon film may be used.

Figure 1B:
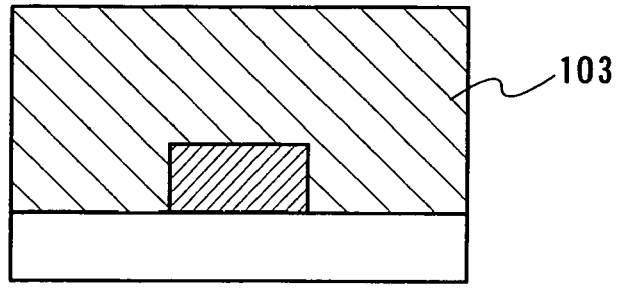

Subsequently, an insulating film 103 is formed to cover the metal wire 102 (see FIG. 1B). The insulating film 103 may be formed using any of silicon oxide ($SiO_x$), silicon nitride ($SiN_x$), silicon oxynitride ($SiO_xN_y$) (x>y), and silicon nitride oxide ($SiN_xO_y$) (x>y). In order to form a dense insulating film with little leak current at a low deposition temperature, a noble gas element such as argon may be mixed with a reactive gas so that the insulating film to be formed contains the noble gas element.

The insulating film 103 formed of these materials may be formed by a known method such as CVD, plasma CVD, and sputtering. Thereafter, if necessary, the surface of the insulating film 103 is planarized by a planarization technique such as CMP and a reflow process where a film is softened and fluidized by heat treatment.

Alternatively, the insulating film 103 may be formed using PSG (phosphorus silicate glass) where phosphorus is added to silicon dioxide, BPSG (boron phosphorus silicate glass) where phosphorus and boron are added to silicon dioxide, SiOF where fluorine is added to silicon dioxide, polyimide, aromatic ether typified by polyarylether and polyfluoro arylether added with fluorine, aromatic hydrocarbon, cyclobutane derivative typified by BCB (benzocyclobutene), and the like. Instead, an insulating film having a siloxane bond may be used, such as MSQ (methyl silsesquioxane), HSQ (hydro silsesquioxane), and MHSQ (methyl hydro silsesquioxane). Note that the insulating film having a siloxane bond generally has a composition of $SiO_xC_yH_z$.

The insulating film 103 formed of these materials may be formed by coating or discharging the materials by a coating method or a droplet discharge method, and then drying and baking them. The insulating film 103 may also be formed by plasma CVD. In the case of using the coating method or the droplet discharge method, the forming condition is preferably changed so as not to form a porous film.

In this embodiment mode, organic siloxane polymer is coated by spin coating, and then baked to obtain the insulating film 103.

Figure 1C:
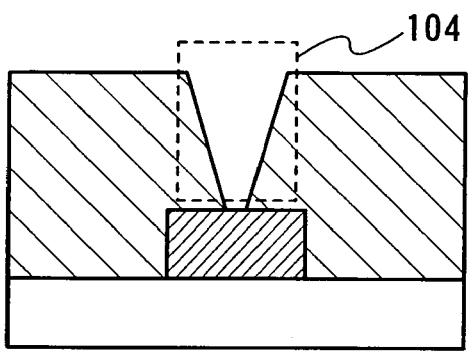

Then, a contact hole 104 is formed (see FIG. 1C). A forming method of the contact hole 104 is described with reference to FIGS. 2A to 2C. The insulating film 103 is coated with a photoresist by a coating method typified by spin coating, and baked. Thereafter, a resist mask 201a and mask 201b are formed by photolithography steps (see FIG. 2A).

The mask may be formed using a commercial resist material containing a photosensitizer, such as a compound of novolac resin and naphthoquinone diazide that is a photosensitizer, diphenylsilanediol, and an acid generator. In using any material, the surface tension and viscosity thereof are arbitrarily controlled by adjusting the concentration of a solvent or adding a surfactant.

Although the trapezoidal resist masks each having a tapered cross section are shown in this embodiment mode, rectangular resist masks such as masks 202a and 202b may also be used (see FIG. 2B). In that case, a rectangular contact hole 203 is formed (see FIG. 2C).

The insulating film 103 is etched using such precisely formed resist masks 201a and 201b, thereby the contact hole 104 is formed to expose a part of the metal wire 102 (see FIG. 1C).

The etching step may be performed by either plasma etching (dry etching) or wet etching. As an etching gas, a fluorine based gas typified by $CF_4$, $NF_3$, $SF_6$, and $CHF_3$, a chlorine based gas typified by $Cl_2$, $BCl_3$, $SiCl_4$, and $CCl_4$, or $O_2$ gas may be used, and an inert gas such as He and Ar may be added appropriately. If the etching step is performed by atmospheric pressure discharge, a discharging process can be locally performed and it is not necessary to form a mask layer over the entire surface of the substrate.

Figure 1D:
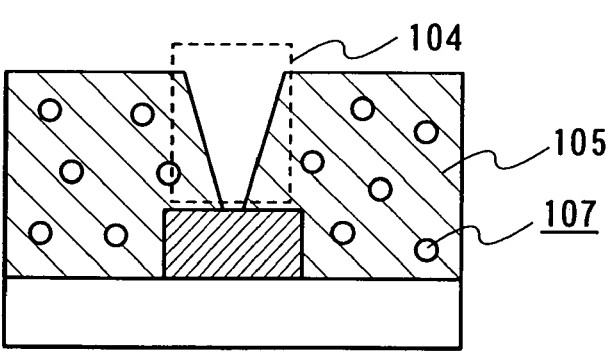
Figure 3A:
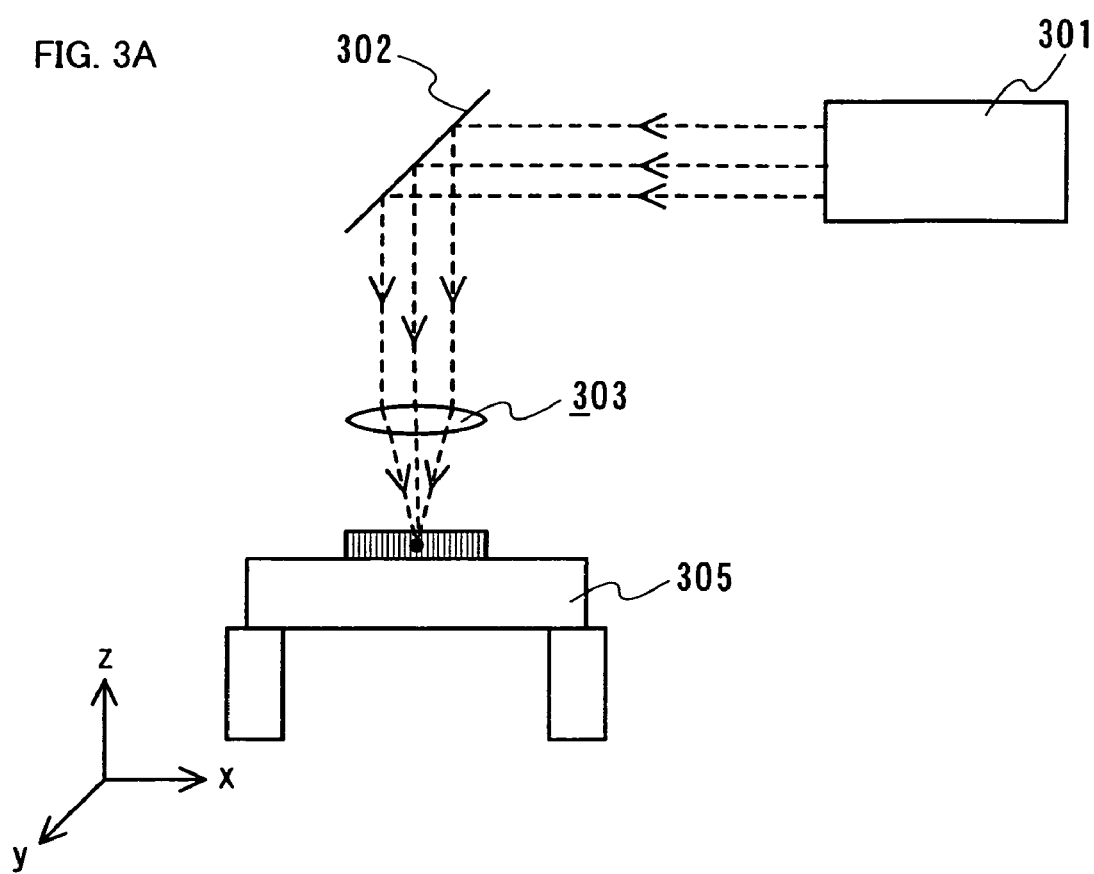
FIGS. 3A and 3B are cross sectional views showing manufacturing steps of a pore in accordance with the invention.
Figure 3B:
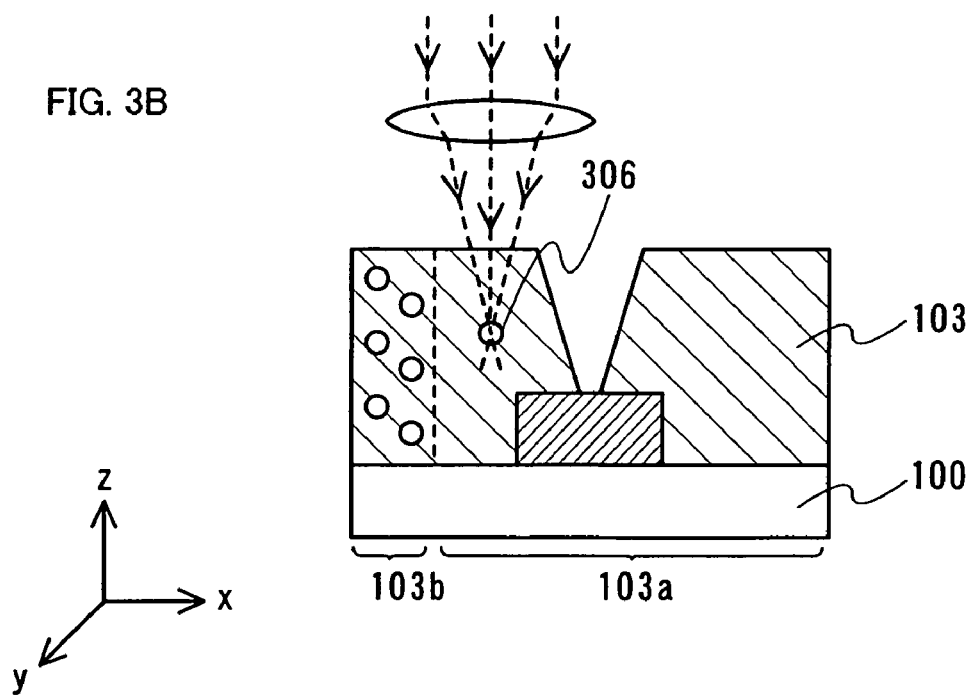

After the resist masks 201a and 201b are removed, the insulating film 103 is irradiated with a laser beam to form a plurality of pores, thereby a porous insulating film 105 is formed (see FIG. 1D). In this embodiment mode, a laser beam emitted from an ultrashort pulse laser is used as the laser beam. A forming method of pores by an ultrashort pulse laser is described with reference to FIGS. 3A and 3B. An ultrashort pulse laser oscillator 301 is a laser oscillator with a pulse width of femtoseconds ($10^{-15}$ seconds). The ultrashort pulse laser oscillator 301 may be a laser having a medium of a crystal of sapphire, YAG, ceramic YAG, ceramic $Y_2O_3$, KGW (potassium gadolinium tungsten), $Mg_2SiO_4$, YLF, $YVO_4$, or $GdVO_4$, each of which is doped with one or a plurality of Nd, Yb, Cr, Ti, Ho, and Er. A laser beam emitted from the fs laser is reflected by a mirror 302, and then condensed in the insulating film 103 by an objective lens 303 with a high numerical aperture (see FIG. 3A). As a result, a pore 306 can be formed in the vicinity of a condensed spot in the insulating film. A porous insulating film is formed by moving the condensed spot using an XYZ stage 305. In FIG. 3B, a region 103a is an insulating film containing no pores whereas a region 103b is a porous insulating film. The fs laser allows processing to be performed only at the beam center with high energy density; therefore, fine processing is enabled using the fs laser having a wavelength that is not easily processed by a normal laser.

The porosity of the porous insulating film 105 is preferably in the range of 20 to 90%. If the porosity is less than 20%, a sufficiently low dielectric constant cannot be obtained. Meanwhile, if the porosity is more than 90%, enough mechanical strength cannot be achieved.

Figure 25A:
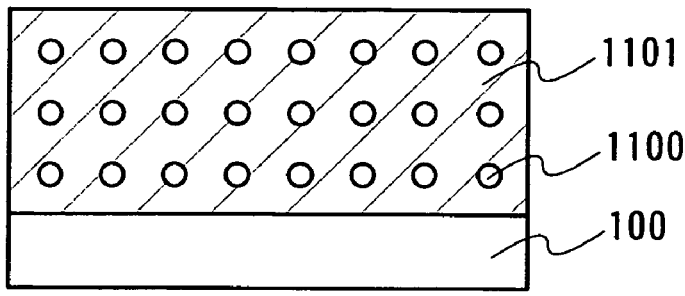
FIGS. 25A to 25D are cross sectional views each showing a structure of an insulating film in accordance with the invention.

Depending on the collecting and irradiating conditions of the laser beam, an insulating film 1101 where pores 1100 are arranged evenly can be obtained as shown in FIG. 25A. The entire of such an insulating film 1101 has a uniform density.

Figure 25B:
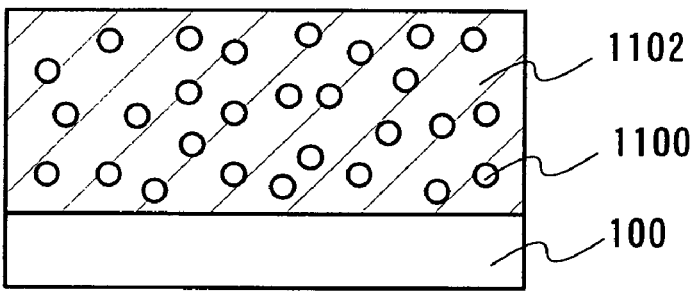

As shown in FIG. 25B, an insulating film 1102 where the pores 1100 are dispersed unevenly can also be formed.

Figure 25C:
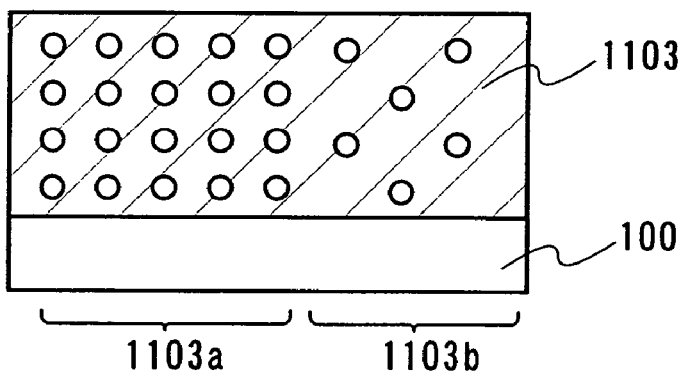

By selecting the irradiation area of the laser beam, an insulating film 1103 having a region 1103a with a high porosity and a region 1103b with a low porosity can be formed as shown in FIG. 25C. As a result, an insulating film with a low relative dielectric constant can be selectively formed.

Figure 25D:
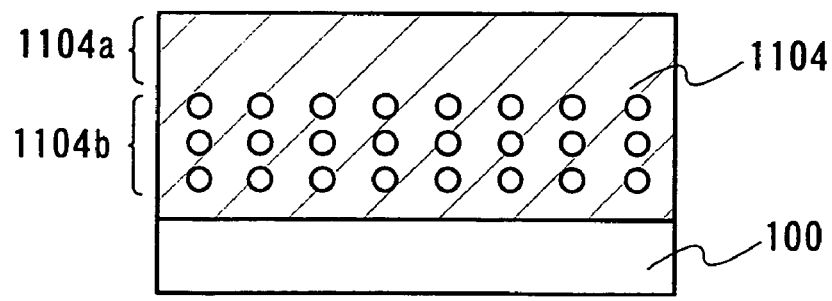

By selecting the depth of a condensed spot, an insulating film 1104 where a region 1104a with a low porosity and a region 1104b with a high porosity are stacked in the direction of the film thickness can be formed as shown in FIG. 25D.

Figure 26A:
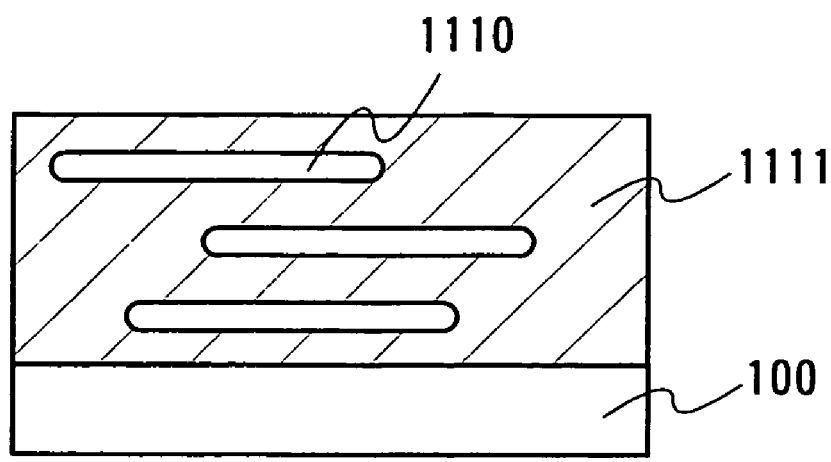
FIGS. 26A and 26B are cross sectional views each showing a structure of an insulating film in accordance with the invention.
Figure 26B:
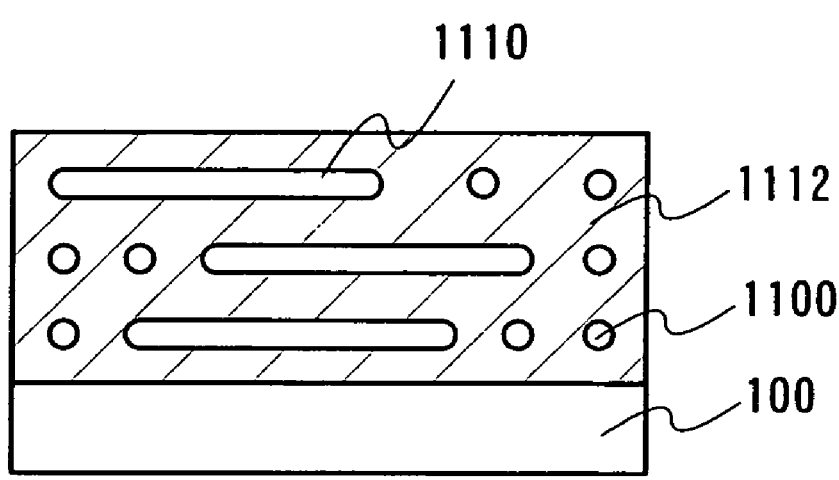

Note that although spherical pores are shown in FIGS. 25A to 25D, the shape of the pores are not limited to this, and an insulating film 1111 having a continuously connected pore 1110 as shown in FIG. 26A may be used arbitrarily. The pore having such a shape can be formed by laser irradiation while moving the irradiation position. Further, an insulating film 1112 having the spherical pore 1100 and the continuously connected pore 1110 as shown in FIG. 26B may be used arbitrarily.

At this time, the insulating film 103 is required to be formed using a material that transmits light having the wavelength of the fs laser, namely, a material that does not absorb light having the wavelength of the fs laser, and more specifically, a material having a higher energy gap than the fs laser. When the fs laser is condensed in the material that transmits light, multiphoton absorption can occur only at a condensed spot where the fs laser is condensed and a pore can be formed. Note that the multiphoton absorption is a process where two or more photons are absorbed simultaneously to make a transition to an eigenstate that corresponds to the sum of energy of the photons. This transition allows light in a wavelength range that is not absorbed to be absorbed, thereby a pore can be formed in a condensed spot having a sufficiently high light energy density.

In this embodiment mode, a concave portion is not formed on the surface of the porous insulating film 105, in particular, on the sidewall of the contact hole 104. Accordingly, an etching gas can be prevented from diffusing in the porous insulating film 105. In addition, a pore can be prevented from being formed between conductive films such as barrier metals and wires, leading to avoidance of a short circuit between the wires. A pore 107 in the porous insulating film 105 has a size of 1 to 2000 nm (preferably, 1000 nm or less), and can be formed by controlling the size, position, density and the like thereof. Therefore, it is possible to reduce uneven film thickness distribution and variations in the relative dielectric constant of the insulating film due to variations in the size of the pore.

Figure 6A:
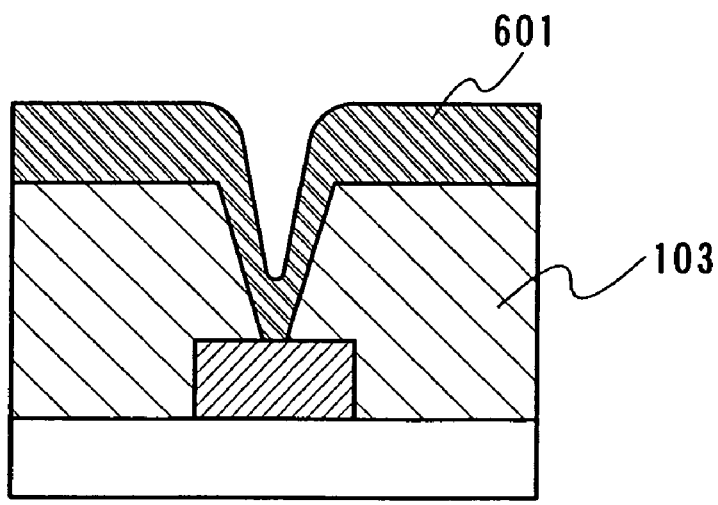
FIGS. 6A to 6C are cross sectional views showing manufacturing steps of a semiconductor device in accordance with the invention.

Alternatively, the contact hole 104 may be formed after the plurality of pores 107 are formed in the insulating film 103 to obtain the porous insulating film 105. At this time, a part of the pore is exposed and a concave portion is formed on the sidewall of the contact hole 104 in some cases. In such a case, it is preferable to form a barrier film 605 described later (see FIGS. 6A to 6C). The barrier film 605 prevents impurities from entering the insulating film 105.

Figure 1E:
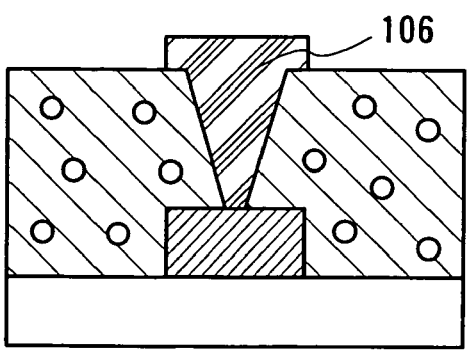

Subsequently, a conductive film 106 is formed by discharging a composition containing a conductive material into the contact hole 104 by a droplet discharge method (see FIG. 1E). The conductive film 106 is formed using a droplet discharge means 401. The droplet discharge means 401 is a collective term of means for discharging a droplet, such as a nozzle having an orifice of composition, and a head having one or more nozzles (see FIG. 4A). The droplet discharge means 401 has a nozzle with a diameter of 0.02 to 100 μm (preferably, 30 μm or less), and the discharge amount of a composition discharged from the nozzle is 0.001 to 100 pl (preferably, 10 pl or less). The discharge amount increases in proportion to the diameter of the nozzle. The distance between an object and the orifice of the nozzle is preferably as short as possible, and reduced to about 0.1 to 3 mm (preferably, 1 mm or less) in order to discharge the composition onto a desired area.

As the composition discharged from the orifice, a solution where a conductive material is dissolved or dispersed in a solvent is used. The conductive material may be a metal such as Ag, Au, Cu, Ni, Pt, Pd, Ir, Rh, W, and Al, a metal sulfide such as Cd and Zn, an oxide such as Fe, Ti, Si, Ge, Zr, and Ba, silver halide particles, dispersed nanoparticles, indium tin oxide (ITO) used as a transparent conductive film, ITSO containing ITO and silicon oxide, organic indium, organotin, zinc oxide, titanium nitride, or the like. However, the composition discharged from the orifice is preferably a solution where gold, silver or copper is dissolved or dispersed in a solvent in view of the resistivity. More preferably, silver or copper that has low resistance may be used. Note that if silver or copper is used, a barrier film is preferably provided for preventing impurities from entering. As the solvent, esters such as butyl acetate and ethyl acetate, alcohols such as isopropyl alcohol and ethyl alcohol, or an organic solvent such as methyl ethyl ketone and acetone may be used. The viscosity of the composition is preferably 50 cp or less for preventing drying and for allowing the composition to be discharged smoothly from the orifice. The surface tension of the composition is preferably 40 mN/m or less. However, the viscosity and the like of the composition may be set appropriately in accordance with the solvent or the application.

It is preferable that the diameter of the conductive particles be as small as possible in order to prevent each nozzle from clogging or to make fine patterns, and more preferably, each particle has a diameter of 0.1 μm or less, though it depends on the diameter of each nozzle or the desired pattern shape. The conductive particles of this size are called nanoparticles. The composition is formed by a known method such as an electrolytic method, an atomization method and wet reduction, and the particle size is generally about 0.01 to 10 μm. Note that if the composition is formed by gas evaporation, nanoparticles protected with a dispersant are as fine as about 7 nm, and the nanoparticles are dispersed stably at room temperature and behave similarly to liquid without aggregation in a solvent when each of them is protected with a coating. Therefore, it is preferable to use a coating.

Particles in the composition discharged by a droplet discharge method are required to have a much smaller diameter than a contact hole. Thus, the composition injected into a contact hole is considered to be a liquid, is not required to be implanted in the contact hole by applying pressure as in the CMP step, and is self-injected. A step of discharging a liquid is preferably performed under reduced pressure since an oxide film and the like are not formed on the surface of the conductor. In particular, a step of discharging a liquid into a contact hole having a diameter of 1 μm or less is preferably performed under reduced pressure to allow smoother injection.

In this embodiment mode, a liquid substance containing Ag (hereinafter referred to as an Ag paste) is discharged as a composition into the contact hole 104.

Figure 4A:
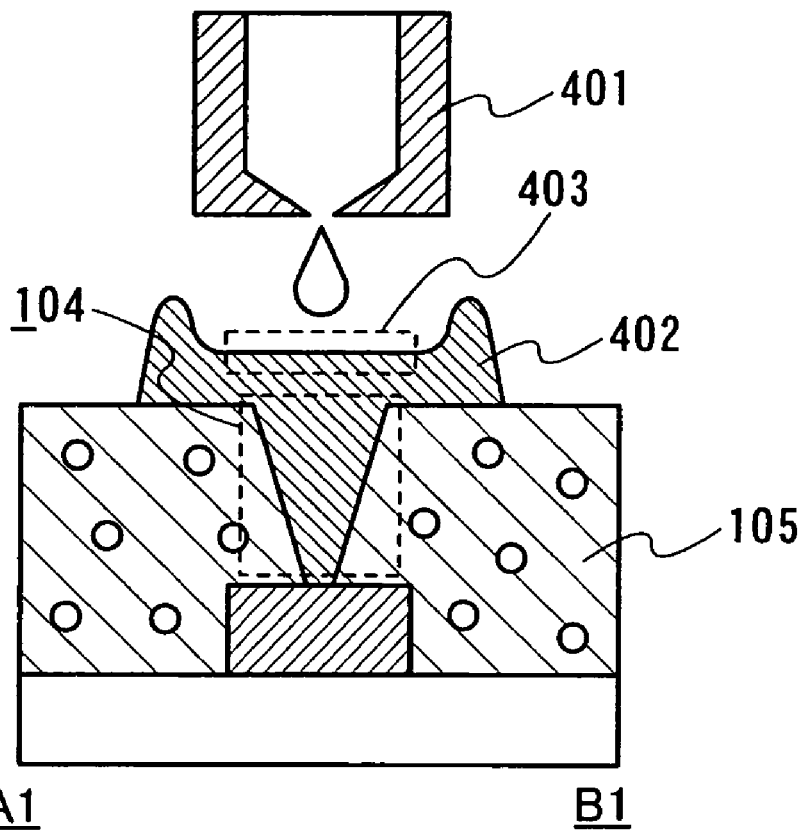
FIGS. 4A and 4B are views showing manufacturing steps of a conductive film in accordance with the invention.
Figure 4B:
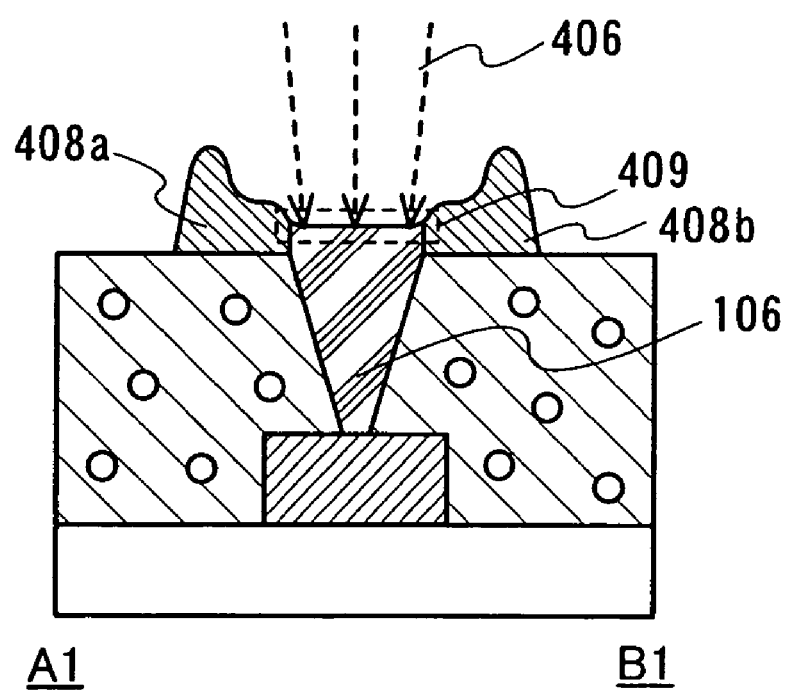
Figure 9A:
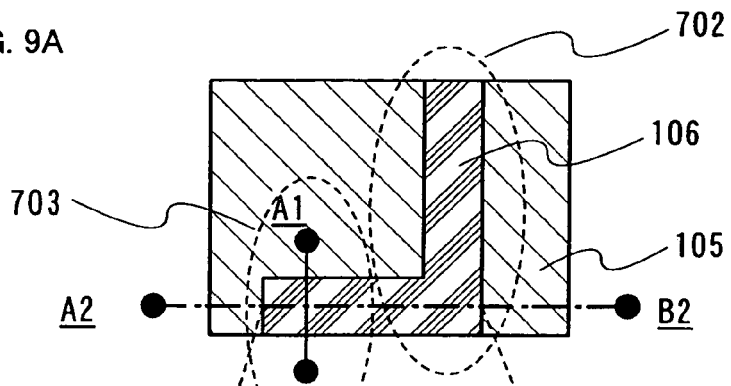
FIGS. 9A to 9D are views showing manufacturing steps of a conductive film in accordance with the invention.
Figure 9B:
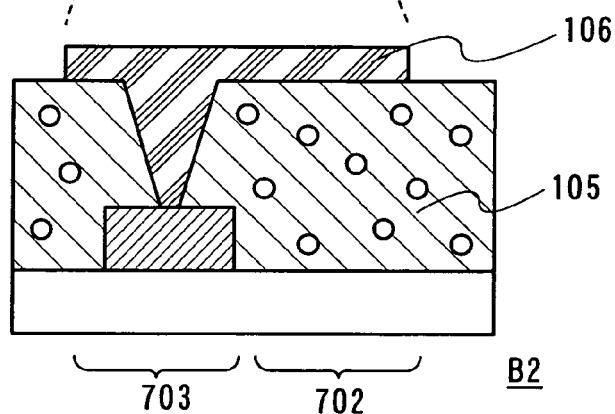

Forming steps of the conductive film 106 by a droplet discharge method are described with reference to FIGS. 4A and 4B and FIGS. 9A to 9D. FIG. 9A is a plan view of the insulating film 105 where the conductive film 106 is formed, and specifically shows a wiring region 702 and a contact portion 703. FIG. 9B is a cross sectional view along a line A2-B2 of FIG. 9A. FIGS. 4A and 4B are cross sectional views along a line A1-B1 of FIG. 9A, which show forming steps of the conductive film 106.

FIG. 4A shows an example where a composition 402 discharged by the droplet discharge means 401 is formed over the contact hole 104 to be concave. Such a shape is easily obtained when the composition is discharged linearly. The width of the composition 402 discharged by the droplet discharge means 401 is made larger than that of the contact hole 104. The thickness of a plane portion 403 of the concave composition 402 is set so that a plane portion 409 of the conductive film 106 formed after baking of the composition projects from the surface of the insulating film 105 (see FIG. 4B). More specifically, the conductive film 106 has a uniform surface in both the wiring region 702 and the contact portion 703 that are shown in FIG. 9B and the surface of the conductive film 106 projects from the insulating film 105.

Then, the composition 402 is irradiated with a laser beam 406 using, in this embodiment mode, a laser beam direct writing system. When a laser beam is scanned across a region to be a desired shape, a solvent in the composition in the region irradiated with the laser beam is evaporated and removed and one or more reactions of melting, sintering and adhesion of conductive particles are accelerated, thereby the conductive film 106 as shown in FIG. 4B is formed. At this time, compositions 408a and 408b that are not irradiated with a laser beam remain on the opposite side of the conductive film 106.

The conductive particles are herein melted entirely or partially depending on the conditions of laser irradiation (particularly, energy density, scanning speed, laser beam spot size, and the like). Sintering is a process of coupling conductive particles by the energy of a laser beam. The adhesion is a process of attaching conductive particles that have been dispersed. One or more reactions of melting, sintering and adhesion are hereinafter collectively referred to as melting.

Figure 5:
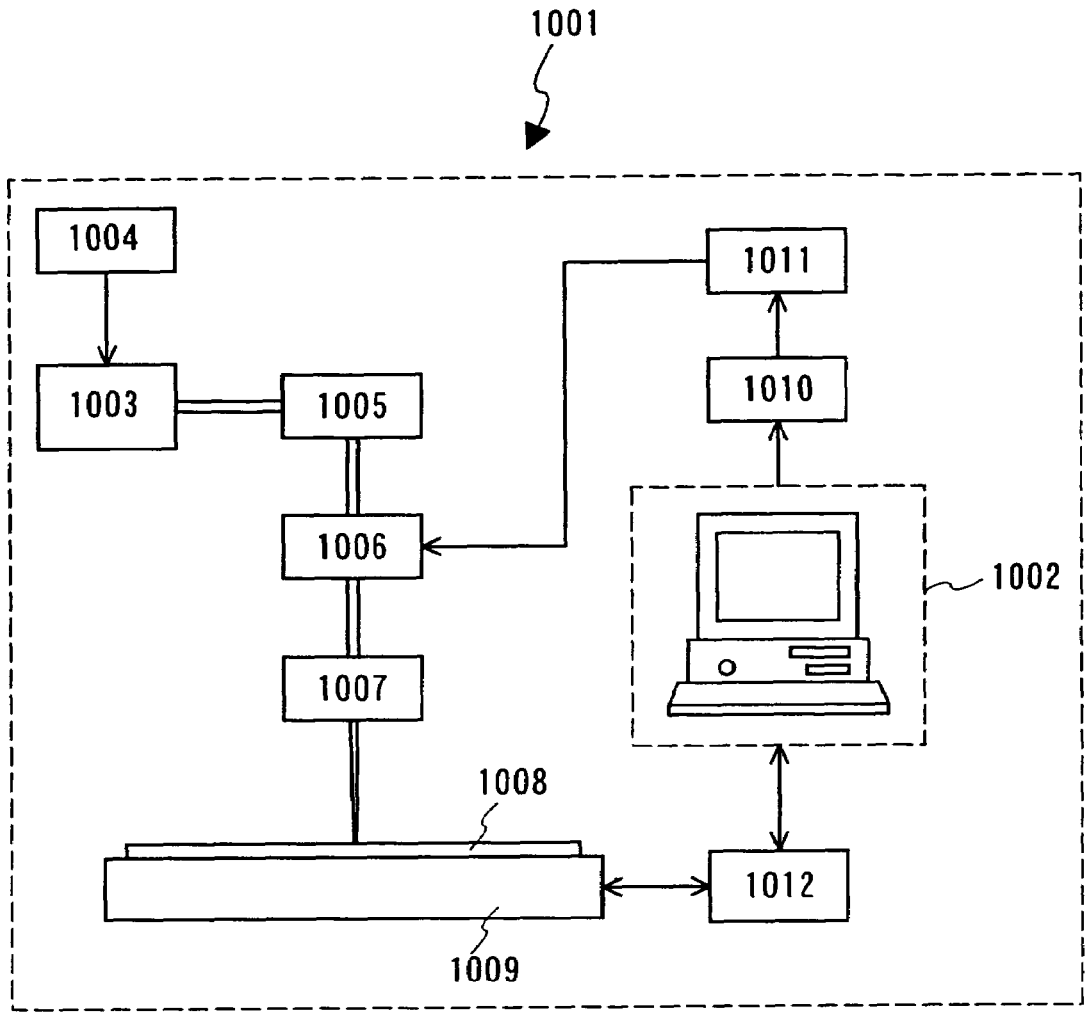
FIG. 5 is a view showing a laser beam direct writing system that can be applied to the invention.

A laser beam direct writing system is described with reference to FIG. 5. As shown in FIG. 5, a laser beam direct writing system 1001 has a personal computer (hereinafter referred to as a PC) 1002 for carrying out various controls in irradiation of a laser beam, a laser oscillator 1003 for outputting a laser beam, a power supply 1004 of the laser oscillator 1003, an optical system (ND filter) 1005 for attenuating a laser beam, an acousto-optic modulator (AOM) 1006 for modulating the intensity of a laser beam, an optical system 1007 constituted by a lens for magnifying or reducing the cross sectional surface of a laser beam, a mirror for changing the optical path, and the like, a substrate moving mechanism 1009 having an X stage and a Y stage, a D/A converter portion 1010 for digital-analog converting the control data outputted from the PC, a driver 1011 for controlling the acousto-optic modulator 1006 in accordance with an analog voltage outputted from the D/A converter portion, and a driver 1012 for outputting a driving signal for driving the substrate moving mechanism 1009.

As the laser oscillator 1003, a laser oscillator capable of oscillating ultraviolet light, visible light or infrared light may be used. The laser oscillator may be an excimer laser oscillator such as KrF, ArF, XeCl, and Xe, a gas laser oscillator such as He, He—Cd, Ar, He—Ne, and HF, a solid state laser oscillator using such crystals as YAG, $GdVO_4$, $YVO_4$, YLF, and $YAlO_3$, each of which is doped with Cr, Nd, Er, Ho, Ce, Co, Ti, or Tm, or a semiconductor laser oscillator such as GaN, GaAs, GaAlAs, and InGaAsP. Note that as for the solid state laser oscillator, the second to fifth harmonics of the fundamental wave are preferably used.

Next, explanation is made on a laser beam irradiation method using the laser beam direct writing system. When a substrate 1008 is placed on the substrate moving mechanism 1009, the PC 1002 detects the position of a marker formed on the substrate using a camera (not shown). Then, the PC 1002 generates movement data for moving the substrate moving mechanism 1009 in accordance with the detected positional data of the marker and the preprogrammed writing pattern data. Subsequently, the PC 1002 controls the amount of light outputted from the acousto-optic modulator 1006 through the driver 1011, and a laser beam outputted from the laser oscillator 1003 is attenuated by the optical system 1005 and then controlled in quantity by the acousto-optic modulator 1006 to have a predetermined quantity of light. Meanwhile, the optical path and beam shape of the laser beam outputted from the acousto-optic modulator 1006 is changed by the optical system 1007 and the laser beam is condensed by the lens. Then, a liquid substance (first pattern) on the substrate is irradiated with the laser beam to melt metal particles in the liquid substance. At this time, the substrate moving mechanism 1009 is controlled to move in the X direction and the Y direction in accordance with the movement data generated by the PC 1002. As a result, a predetermined area is irradiated with the laser beam, and the melting of the conductive particles in the composition is performed.

The energy of the laser beam is partially converted to heat in the composition, which causes a reaction of a part of the pattern to form a conductive film. A laser beam with a shorter wavelength can be condensed to have a shorter diameter of beam. Accordingly, a conductive film with a narrow width can be formed by irradiating a laser beam with a short wavelength. In addition, in order to obtain a minute pattern, thermal diffusion distance in the pattern irradiated with a laser beam is also important, and it is preferable that an Ag film be irradiated with a laser beam for 10 ns or less to form a pattern of 1 µm or less. Therefore, laser irradiation is preferably performed using a laser oscillator having a pulse width that is an order of picosecond ($10^{-12}$) or less.

The laser beam spot on the surface of the pattern may be processed by the optical system so as to have a dotted shape, circular shape, elliptical shape, rectangular shape, or linear shape (to be exact, elongated rectangular shape).

Although the substrate is selectively irradiated with the laser beam while being moved in this embodiment mode, the invention is not limited to this and the substrate may be irradiated with the laser beam while scanning the laser beam in the XY axis directions. In this case, a polygon mirror, a galvanometer mirror, or an acousto-optic deflector (AOD) is preferably used for the optical system 1007. Alternatively, a predetermined area of the substrate may be irradiated with the laser beam while scanning the laser beam in one of the XY axis directions and moving the substrate in the other direction.

In this embodiment mode, an Ag paste discharged by a droplet discharge method is partially irradiated with a laser beam from Nd:YVO$_4$ and one or more reactions of melting, sintering and adhesion of Ag particles are appropriately performed, thereby the conductive film 106 made of silver is formed. The region irradiated with the laser beam functions as the conductive film herein. Accordingly, if a laser beam is scanned once, the width of the conductive film is substantially equal to that of the beam spot. Since a part of the composition is irradiated with a laser beam in this embodiment mode, the compositions 408a and 408b remain on the opposite side of the conductive film 106 (see FIG. 4B). Conductive particles are dispersed in the compositions 408a and 408b. Laser irradiation is performed in oxygen atmosphere, nitrogen atmosphere, or atmospheric air.

Subsequently, the remaining compositions 408a and 408b are removed to expose the conductive film 106 (see FIG. 1E). A peeling liquid capable of removing a solvent in the composition is arbitrarily selected to remove the remaining compositions 408a and 408b. An alkaline organic solution is used herein to remove the solvent. The conductive film 106 is made of conductive particles that irregularly overlap in three dimensions, namely, made of three-dimension aggregate particles. Therefore, the surface of the conductive film 106 has minute unevenness.

Figure 7A:
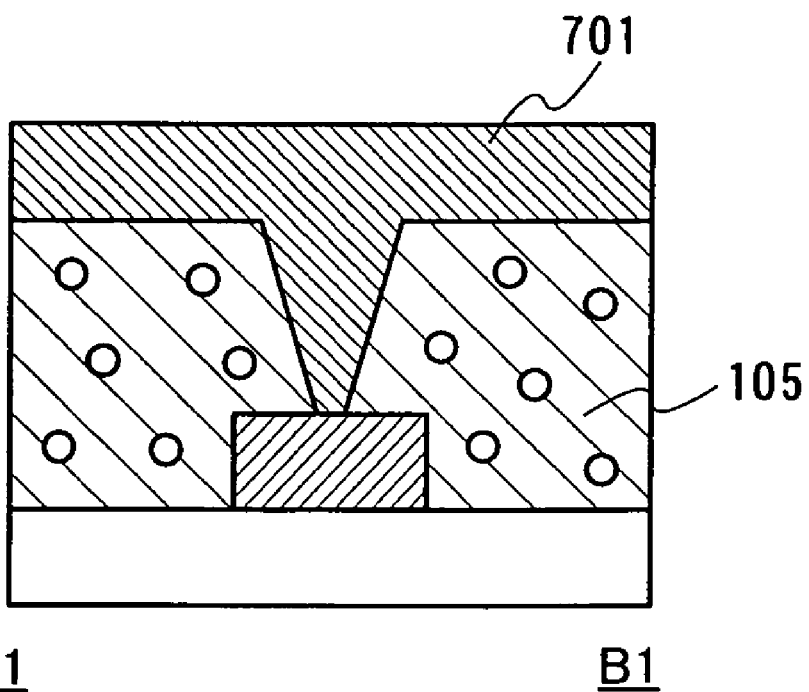
FIGS. 7A and 7B are views showing manufacturing steps of a conductive film in accordance with the invention.
Figure 7B:
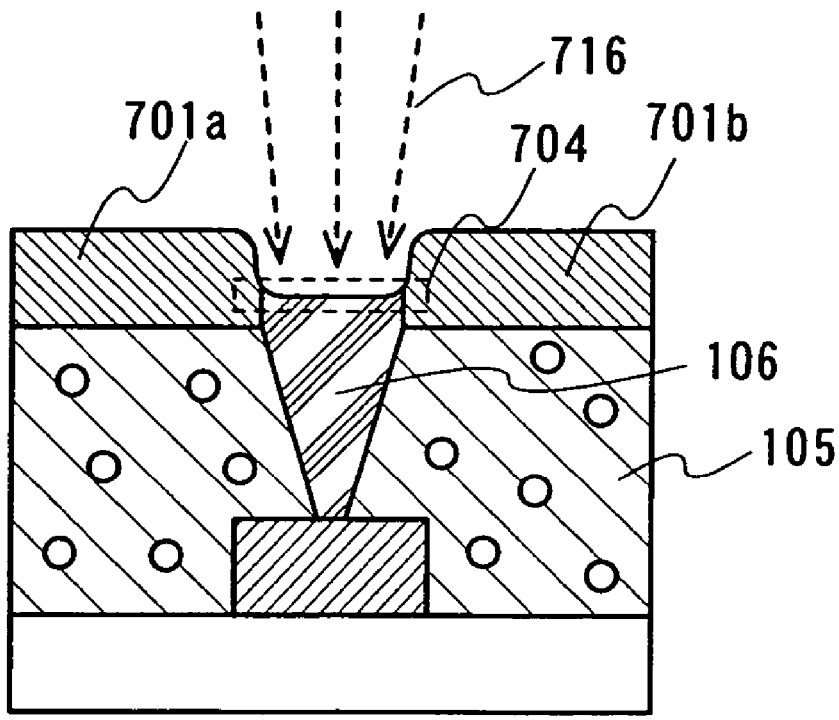

An example where the entire surface of a composition 701 discharged by a droplet discharge method has uniformity is described with reference to FIGS. 7A and 7B and FIGS. 9A to 9D. FIGS. 7A and 7B are cross sectional views along a line A1-B1 of FIG. 9A, which show steps of forming a conductive film. Such a composition having a plane surface is easily formed when it is discharged to be a rectangular or plane shape. At this time, the thickness of the composition 701 is set so that a plane portion 704 of the conductive film 106 formed after baking of the composition projects from the surface of the insulating film 105. More specifically, the conductive film 106 has a uniform thickness in both the wiring region 702 and the contact portion 703 that are shown in FIG. 9B, and the surface of the conductive film 106 projects from the insulating film 105. In this embodiment mode, a part of the composition 701 is irradiated with a laser beam 716 to form the conductive film 106.

Compositions 701a and 701b remain on the opposite side of the conductive film 106 (see FIG. 7B). Conductive particles are dispersed in the compositions 701a and 701b. Then, the remaining compositions 701a and 701b are removed to expose the conductive film 106 (see FIG. 1E).

Figure 8A:
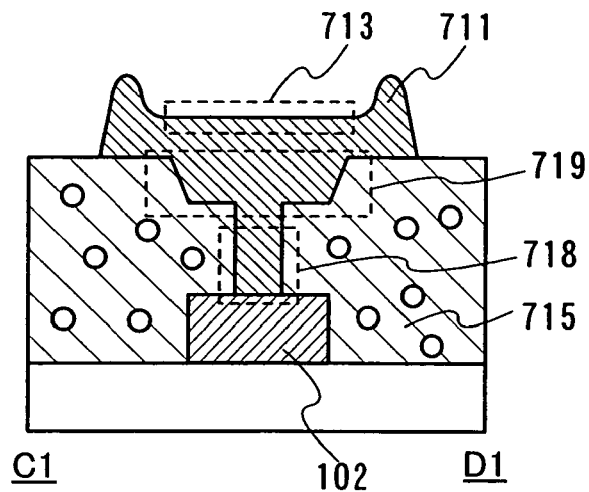
FIGS. 8A to 8C are views showing manufacturing steps of a conductive film in accordance with the invention.
Figure 8B:
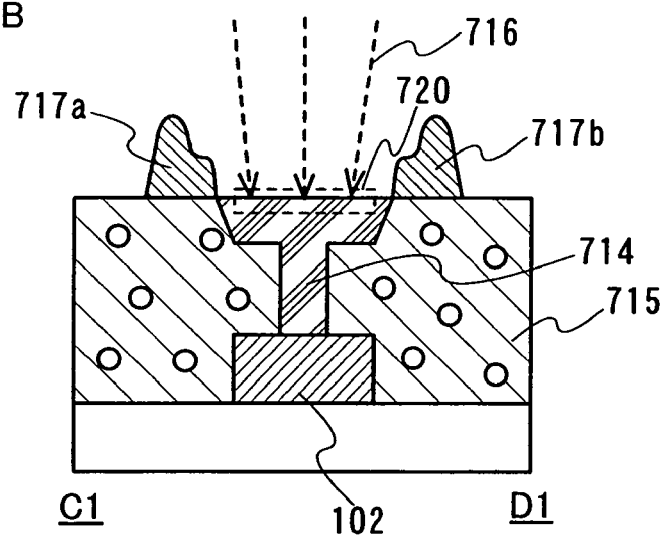
Figure 8C:
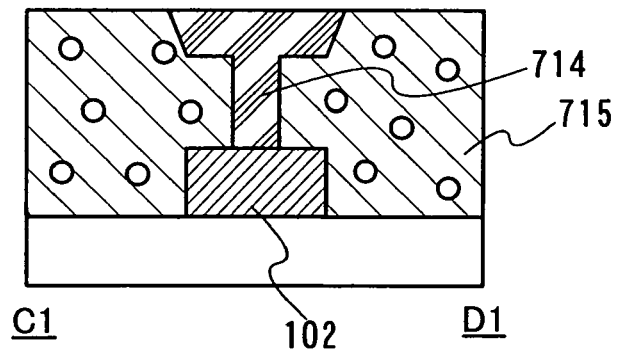
Figure 9C:
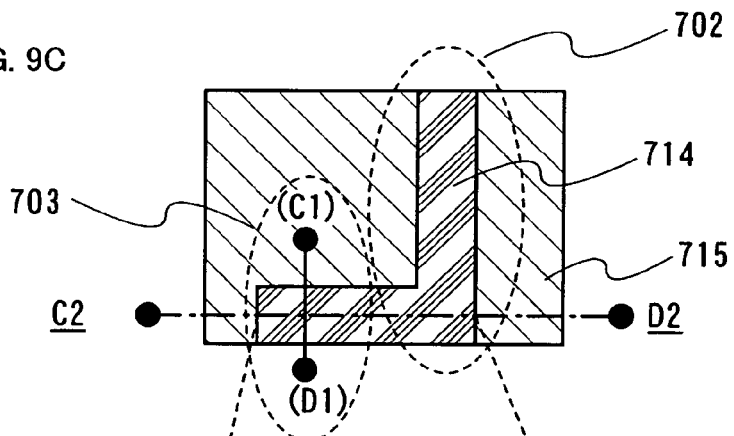
Figure 9D:
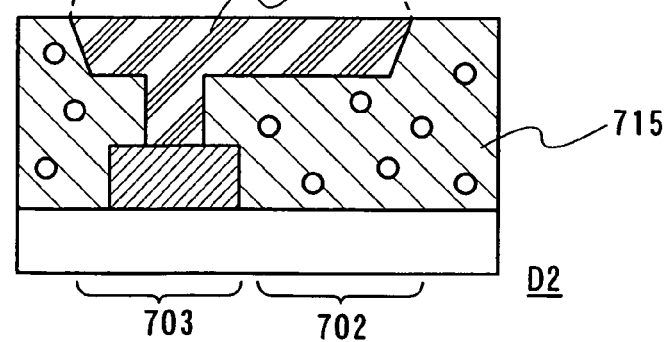

The contact hole 104 shown in FIG. 1C may have such a shape that is constituted by a contact hole 718 that reaches the metal wire 102, and a wiring groove 719 that is connected to the contact hole 718. An example of a conductive film implanted in an insulating film is described with reference to FIGS. 8A to 8C and FIGS. 9A to 9D. FIG. 9C is a plan view of an insulating film 715 where a conductive film 714 is implanted, and specifically shows the wiring region 702 and the contact portion 703. FIG. 9D is a cross sectional view along a line C2-D2 of FIG. 9C. FIGS. 8A to 8C are cross sectional views along a line C1-D1 of FIG. 9C, which show forming steps of the conductive film 714.

A composition 711 discharged by a droplet discharge method is formed to have a larger width than that of the wiring groove 719 (see FIG. 8A). In that case, the thickness of a plane portion 713 of the composition 711 is determined so that a plane portion 720 of the conductive film 714 formed after baking of the composition has substantially the same height as the surface of the insulating film 715. More specifically, the conductive film 714 has a uniform thickness in both the wiring region 702 and the contact portion 703 that are shown in FIGS. 9C and 9D (see FIG. 8B). In this embodiment mode, a part of the composition 711 is irradiated with the laser beam 716 to form the conductive film 714. Then, remaining compositions 717a and 717b are removed, so that the conductive film 714 implanted in the insulating film 715 can be formed (see FIG. 8C and FIG. 9D).

Figure 6B:
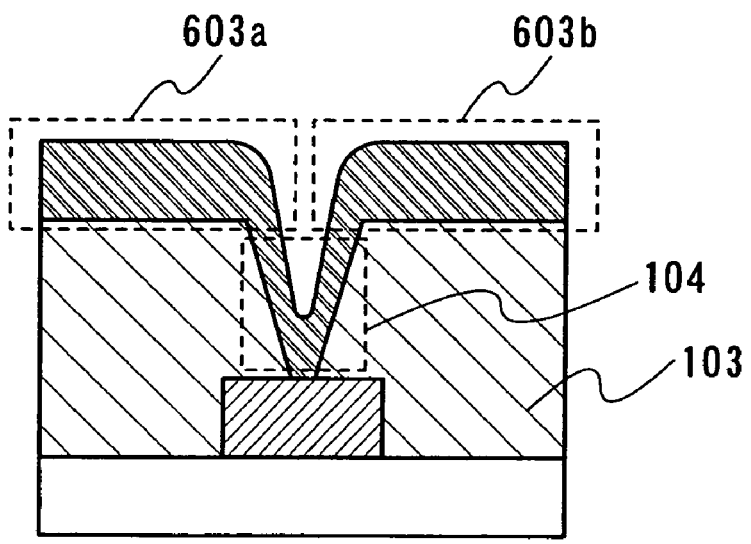
Figure 6C:
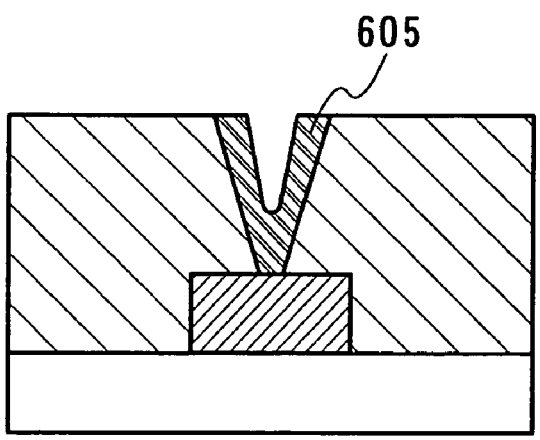

Although not described in this embodiment mode, after forming the contact hole 104, a barrier film 605 may be formed in a contact portion between the contact hole of the insulating film 103 and the conductive film, so that the adhesiveness between the wire and the insulating film is improved, the resistance between the wires is reduced, and conductive substances and impurities are prevented from being diffused (see FIG. 6C). In order to obtain the barrier film 605, a barrier film 601 is formed by a known method such as electroless deposition, electrolytic plating, PVD (Physical Vapor Deposition), CVD (Chemical Vapor Deposition), vapor deposition, and ALD (Atomic Layer Deposition) (see FIG. 6A).

Subsequently, portions other than the inside of the contact hole 104, namely, barrier metals 603a and 603b formed on the insulating film 103 are polished and removed by CMP under conditions suitable for polishing metals (see FIG. 6B). At this time, the insulating film 103 has enough mechanical strength to withstand CMP since there are no pores for reducing a dielectric constant. As a result, as shown in FIG. 6C, the barrier film 605 can be formed inside the contact hole 104.

The barrier film 605 may be formed using a metal such as tungsten (W), molybdenum (Mo), tantalum (Ta), and titanium (Ti), an alloy or a metal nitride of them, or an alloy with silicon (Si). Alternatively, a plurality of layers of them may be stacked, and typically, a tantalum nitride (TaN) film and a tungsten film may be stacked in this order over the surface of the substrate.

Then, as shown in FIG. 1D and thereafter, the plurality of pores 107 are formed in the insulating film 103 to obtain the porous insulating film 105. Further, a composition is discharged onto the barrier film 605 and baked to form a conductive film.

By repeating the aforementioned steps, the multilayer semiconductor device can be completed. Since the semiconductor device obtained by this embodiment mode has an insulating film containing a plurality of pores, a low dielectric constant is achieved. Therefore, parasitic capacitance between wires can be reduced and a highly integrated semiconductor device can be obtained.

Embodiment Mode 2

In this embodiment mode, forming steps of a porous insulating film and wires over a single crystalline semiconductor substrate are described with reference to FIGS. 10A to 10E.

Figure 10A:
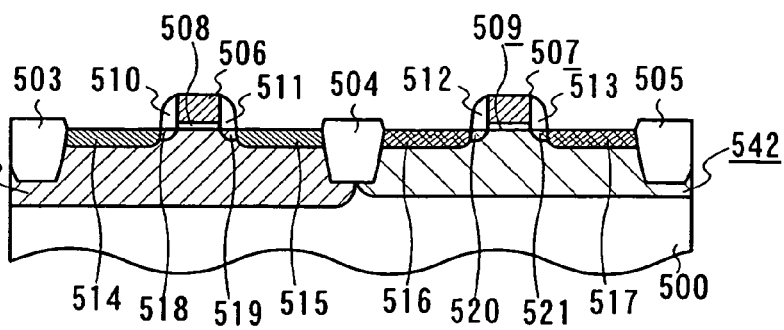
FIGS. 10A to 10E are cross sectional views showing manufacturing steps of a semiconductor device in accordance with the invention.

As shown in FIG. 10A, element isolation regions 503 to 505 are formed over a substrate 500. The substrate 500 is a single crystalline semiconductor substrate or a compound semiconductor substrate, and typically, an N-type or P-type single crystalline silicon substrate, a GaAs substrate, an InP substrate, a GaN substrate, a SiC substrate, a sapphire substrate, a ZnSe substrate or the like. Instead, an SOI (Silicon On Insulator) substrate may be used. In this embodiment mode, a single crystalline silicon substrate is used as the substrate 500. The element isolation regions 503 to 505 may be formed by a known method such as a selective oxidation method (LOCOS: Local Oxidation of Silicon) and a trench isolation method. In this embodiment mode, silicon oxide films are formed as the element isolation regions 503 to 505 by the trench isolation method. After that, a P-well region 501 and an N-well region 502 are formed by well ion implantation. Further, channel stop ion implantation and threshold voltage adjustment ion implantation are performed as needed.

The surface of the substrate 500 is washed to be exposed. Then, a first insulating film is formed by a known method, and a first conductive film is formed over the first insulating film. The first insulating film and the first conductive film may be formed using the same material and deposition method as known gate insulating film and gate electrode, respectively. A mask pattern is formed over the first conductive film, and the first conductive film is etched using the mask pattern, thereby gate electrodes 506 and 507 are formed. An impurity element is added to the substrate 500 using the mask pattern and the gate electrodes 506 and 507 as masks to form impurity regions in a self-aligned manner. The first insulating film is etched using the mask pattern and the gate electrodes 506 and 507 as masks to form gate insulating films 508 and 509. After the mask pattern is removed, a second insulating film is formed and anisotropically etched, thereby sidewalls 510 to 513 are formed. An impurity element is added using the gate electrodes 506 and 507 and the sidewalls 510 to 513 as masks. The impurity element is activated by heat treatment, GRTA, LRTA or the like to form source and drain regions 514 to 517 and low concentration impurity regions 518 to 521. The source and drain regions 514 and 515 formed in the P-well region 501 are n$^+$ regions doped with phosphorus, while the low concentration impurity regions 518 and 519 are n$^-$ regions. The source and drain regions 516 and 517 formed in the N-well region 502 are p$^+$ regions doped with boron, while the low concentration impurity regions 520 and 521 are p$^-$ regions. Note that the n$^-$ region and the p$^-$ region may be formed appropriately, and the transistors do not necessarily have these regions.

Figure 10B:
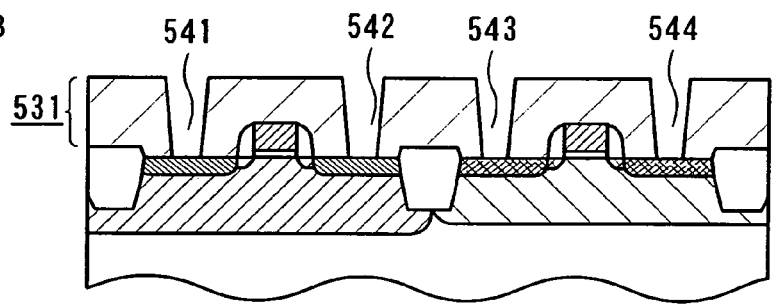

Subsequently, as shown in FIG. 10B, a third insulating film 531 is formed by a known method such as CVD, sputtering, coating, and heat treatment. In this embodiment mode, BPSG (borophosphosilicate glass) is coated and heated to form a silicon oxide film. Then, a part of the third insulating film 531 is etched to form contact holes 541 to 544 and to expose a part of the source and drain regions 514 to 517.

Figure 10C:
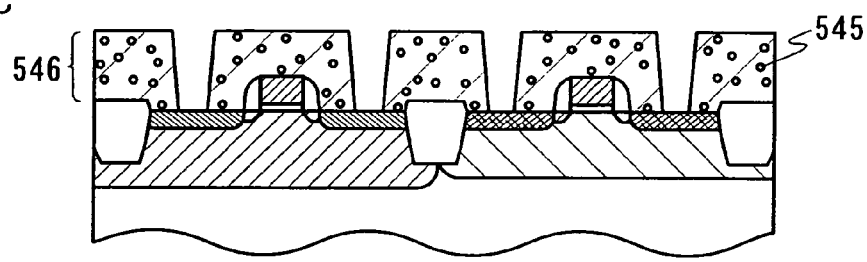

As shown in FIG. 10C, the third insulating film 531 including the contact holes is irradiated with a laser beam emitted from an fs laser, thereby a pore 545 is formed to obtain a porous insulating film 546.

Figure 10D:
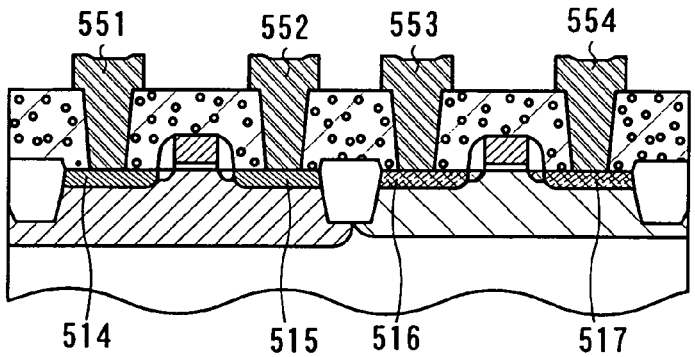
Figure 10E:
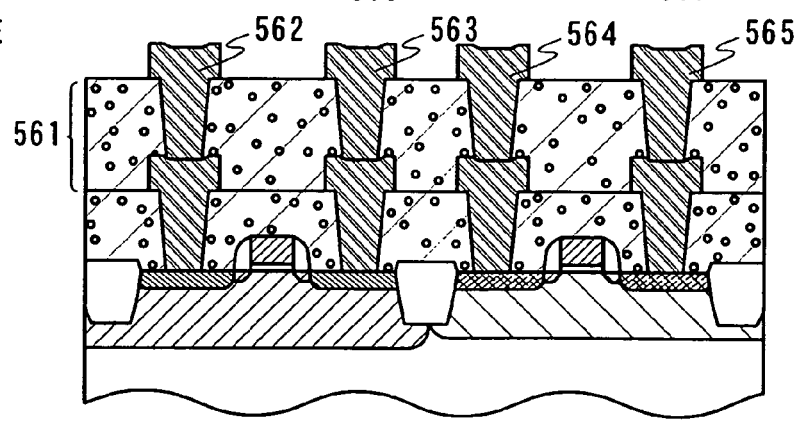

As shown in FIG. 10D, a composition is discharged into the contact holes by a droplet discharge method, and partially irradiated with a laser beam and baked, thereby conductive films 551 to 554 are formed.

After that, a porous insulating film 561 and conductive films 562 to 565 are repeatedly formed to obtain multilayer interconnects.

Through the aforementioned steps, the semiconductor device having an insulating film with a low dielectric constant can be completed.

When an SOI (Silicon On Insulator) substrate is used as the substrate 500 and the silicon substrate is peeled off from an insulating oxide film by a known peeling method, a MOS transistor can be peeled off. Further, when the MOS transistor that has been peeled off is attached to a flexible substrate, the semiconductor device can be reduced in thickness.

The semiconductor device shown in this embodiment mode may be applied to various semiconductor devices such as a bipolar transistor as well as the MOS transistor. The semiconductor device may also be applied to various circuits such as a memory and a logic circuit.

Embodiment 1

Manufacturing steps of an active matrix substrate and a display panel having it are described with reference to FIGS. 1A to 11D, FIGS. 12A to 12C, and FIGS. 13 and 14. In this embodiment, a liquid crystal display panel is used as the display panel. FIG. 14 is a plan view of an active matrix substrate, and FIGS. 11A to 11D, FIGS. 12A to 12C and FIG. 13 are schematic views showing longitudinal cross sectional structures along a line A-B in a connecting terminal portion and lines C-D and E-F in a pixel portion of FIG. 14.

As shown in FIG. 11A, a first insulating film 801 with a thickness of 100 nm is formed on the surface of a substrate 800. In this embodiment, a silicon nitride film is formed by plasma CVD as the first insulating film 801. A first conductive film is formed over the first insulating film 801 and a mask is formed over the first conductive film. The first conductive film is etched using the mask to form a first conductive film 802a functioning as a gate wire, a first conductive film 802b functioning as a connecting portion between the gate wire and a gate electrode, and a second conductive film 802c functioning as the gate electrode. Since an aluminum nitride film having high thermal conductivity is used as the first insulating film in this embodiment, TFTs formed later can generate heat uniformly over the entire substrate. As a result, variations in characteristics of TFTs can be reduced, which is preferable particularly when TFTs are formed over a large substrate.

The first conductive film is preferably formed using a high melting point material. The use of the high melting point material allows heat treatment such as crystallization, gettering, and activation to be performed in subsequent steps. As the high melting point material, it is possible to use a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), and platinum (Pt), an alloy of them, or a metal nitride of them. Instead, a plurality of layers of them may be stacked. Typically, a stacked layer structure may be adopted, where a tantalum nitride film and a tungsten film, a tantalum nitride film and a molybdenum film, a titanium nitride film and a tungsten film, or a titanium nitride film and a molybdenum film are stacked in this order over the surface of the substrate. Alternatively, silicon (including amorphous semiconductor and crystalline semiconductor) containing phosphorus, indium tin oxide, zinc oxide, indium zinc oxide, zinc oxide doped with gallium, or indium tin oxide containing silicon oxide may be used as well. The first conductive film is formed by sputtering, vapor deposition, CVD, coating or the like.

In this embodiment, AN100 produced by Asahi Glass, Co., Ltd. is used as the substrate 800 and a tungsten film with a thickness of 110 nm is formed by sputtering as the first conductive film. Then, polyimide is discharged onto the first conductive film to be used as a first mask. After drying and baking, the first conductive film is etched using the polyimide layer as a mask, thereby the first conductive films 802*a*, 802*b* and 802*c* are formed.

A second insulating film functioning as a gate insulating film is formed over the first conductive films 802*a*, 802*b* and 802*c*. As the second insulating film, a silicon nitride film (silicon nitride oxide film) 803 with a thickness of 110 nm and a silicon oxide film (silicon oxynitride film) 804 are stacked in this order over the substrate 800. Further, such an insulating film may be formed after forming an anodic oxide film formed by anodizing the first conductive film.

An amorphous semiconductor film 805 with a thickness of 10 to 100 nm is formed over the second insulating film. In this embodiment, an amorphous silicon film 805 with a thickness of 100 nm is formed by CVD. Then, layer 806 containing a catalytic element is formed over the surface of the amorphous semiconductor film 805. The catalytic element is a metal element having a function of accelerating crystallization of the amorphous semiconductor film. In this embodiment, a solution containing a nickel catalyst of 50 ppm is applied by spin coating. Subsequently, the amorphous semiconductor film 805 is heated to form a crystalline semiconductor film 811 as shown in FIG. 11B. Note that the crystalline semiconductor film 811 contains a catalytic element. In this embodiment, the semiconductor film is dehydrogenized by heating at a temperature of 500° C. for one hour using an electric furnace, and then heat treatment is performed at a temperature of 550° C. for four hours to form a crystalline silicon film containing nickel. After that, a channel doping step is performed entirely or selectively so that a P-type or N-type impurity element is added at a low concentration to a region that is to be a channel region of a TFT later.

A semiconductor film 812 with a thickness of 100 nm containing a donor element is formed over the surface of the crystalline semiconductor film 811 containing a catalytic element. In this embodiment, an amorphous silicon film containing phosphorus is formed using silane gas and 0.5% phosphine gas (flow rate, silane:phosphine=10:17).

The crystalline semiconductor film 811 and the semiconductor film 812 containing a donor element are heated for gettering the catalytic element and activating the donor element. That is to say, the catalytic element in the crystalline semiconductor film 811 is moved to the semiconductor film 812 containing a donor element. Reference numeral 813 in FIG. 11C denotes a crystalline semiconductor film with a reduced concentration of the catalytic element, which is a crystalline silicon film herein. In addition, the semiconductor film containing a donor element, to which the catalytic element is moved, becomes a crystalline semiconductor film by heating, namely, a crystalline semiconductor film containing a catalytic element and a donor element. Such a crystalline semiconductor film is denoted as 814 in FIG. 11C, which is a crystalline silicon film containing nickel and phosphorus herein.

A third mask 815 is formed over the crystalline semiconductor film 814 containing a catalytic element and a donor element. The third mask 815 is formed by discharging polyimide onto the crystalline semiconductor film 814 containing a catalytic element and a donor element by a droplet discharge method, and by heating at a temperature of 200° C. for 30 minutes. The third mask 815 is formed over a region where a first semiconductor region is formed later.

As shown in FIG. 11D, the crystalline semiconductor film 814 containing a catalytic element and a donor element is etched using the third mask 815, thereby a first semiconductor region (source and drain regions, and a contact layer) 821 is formed. In addition, a second semiconductor region 822 is formed by etching the crystalline semiconductor film 813 with a reduced concentration of a catalytic element. The crystalline semiconductor film 814 containing a catalytic element and a donor element and the crystalline semiconductor film 813 with a reduced concentration of a catalytic element are etched using a mixed gas having a flow rate of $CF_4:O_2=10:9$. After that, the third mask 815 is removed using a peeling liquid.

Figure 12A:
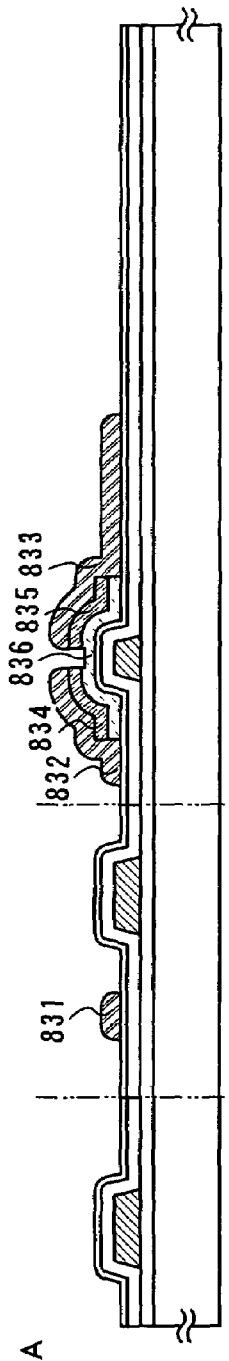
FIGS. 12A to 12C are cross sectional views showing manufacturing steps of a semiconductor device in accordance with the invention.

As shown in FIG. 12A, second conductive films 831 to 833 are formed over the first semiconductor region 821 and the second insulating film. The second conductive films 831 to 833 function as any of a source wire, a source electrode and a drain electrode. In this embodiment, the second conductive films 831 to 833 are formed by discharging a liquid substance containing dispersed Ag (silver) particles and by heating.

The first semiconductor region 821 is etched using the second conductive films 832 and 833 as masks, thereby third semiconductor regions 834 and 835 functioning as source and drain regions are formed. At this time, the second semiconductor region 822 is partially etched. The etched second semiconductor region is denoted as a fourth semiconductor region 836. The fourth semiconductor region 836 functions as a channel forming region.

A protective film may be formed thereafter. As the protective film, a silicon oxide film may be formed as an insulating film in contact with the fourth semiconductor region 836, and a silicon nitride film may be formed thereon. The protective film can prevent external contaminants from entering the semiconductor element.

A third insulating film is formed by coating siloxane polymer and baking herein. The surface of the substrate is washed with pure water and coated with a solution to improve wettability, and then a solution where a siloxane polymer precursor is dissolved in a solvent is applied by spin coating. After that, the solution as well as the substrate is heated to accelerate evaporation of the solvent and cross-linking reaction of the siloxane polymer precursor, thereby a third insulating film can be obtained.

The third insulating film is irradiated with a laser beam emitted from an fs laser oscillator so that a plurality of pores 841 are formed in the third insulating film and a porous fourth insulating film 842 is formed.

Figure 12B:
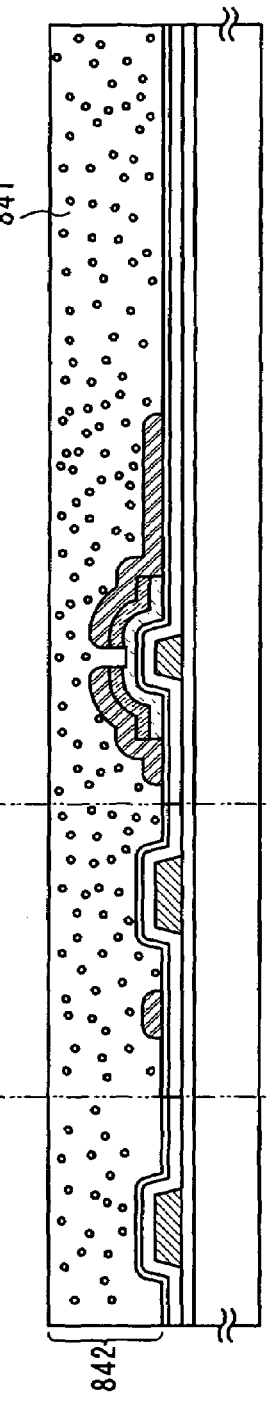
Figure 12C:
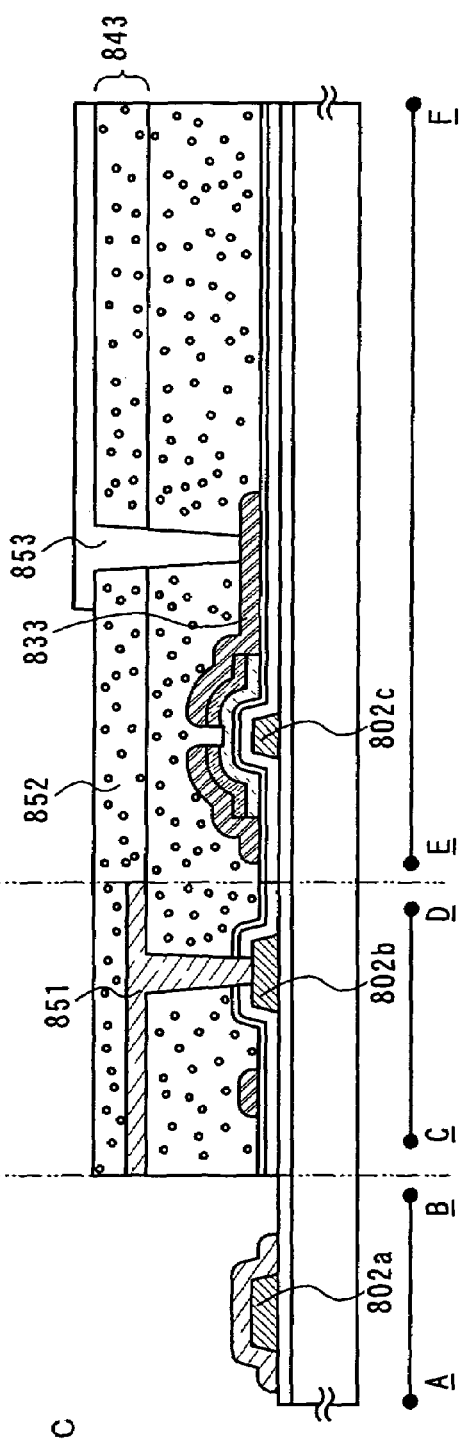

As shown in FIG. 12C, the second insulating film and the third insulating film are etched to expose the first conductive films 802a and 802b.

A third conductive film 851 is formed so as to be in contact with the exposed portions of the first conductive films 802a and 802b. The third conductive film 851 may be formed in the same way as the second conductive films 831 to 833. The third conductive film 851 functions as a scan line (gate wire).

A porous fifth insulating film 843 is formed in the same way as the fourth insulating film 842. Then, the porous fifth insulating film 843 is partially etched to expose a part of the second conductive film 833, and a fourth conductive film 853 with a thickness of 100 to 300 nm is formed so as to be in contact with the second conductive film 833. The fourth conductive film 853 may be formed using a light transmissive conductive film or a light reflective conductive film. The light transmissive conductive film may be indium tin oxide (ITO), zinc oxide (ZnO), indium zinc oxide (IZO), zinc oxide doped with gallium (GZO), indium tin oxide containing silicon oxide, or the like. The light reflective conductive film may be a metal such as aluminum (Al), titanium (Ti), silver (Ag), and tantalum (Ta), a metal material containing such a metal and nitrogen at a concentration of stoichiometric composition ratio or less, titanium nitride (TiN) or tantalum nitride (TaN) that is a nitride of such a metal, aluminum containing 1 to 20% of nickel, or the like. The third conductive film 851 is formed by a droplet discharge method, coating, sputtering, vapor deposition, CVD or the like. If the coating, sputtering, vapor deposition, CVD and the like are adopted, a mask is formed by a droplet discharge method or by exposure using a laser beam direct writing system, and then the conductive film is etched to form the conductive film 851. In this embodiment, an aluminum film with a thickness of 110 nm is formed by sputtering and etched to be a desired shape, thereby the fourth conductive film 853 functioning as a pixel electrode is formed.

Note that FIG. 14 can be referred to, which is a plan view along lines C-D and E-F of FIG. 12B.

Although the fourth conductive film 853 is formed after forming the third conductive film 851 in this embodiment, the invention is not limited to these steps, and the third conductive film 851 may be formed after forming the fourth conductive film 853.

Through the aforementioned steps, the active matrix substrate can be completed. The active matrix substrate formed in this embodiment uses a highly heat resistant material for the gate electrode, and wires such as a signal line and a scan line are formed using a low resistant material after heat treatment such as activation, gettering and crystallization. It is thus possible to form a TFT that has crystallinity, few impurity metal elements, and low wire resistance.

A TFT constituted by a crystalline semiconductor film has several tens to 50 times higher mobility than a reversed staggered TFT constituted by an amorphous semiconductor film. The source and drain regions include a catalytic element as well as an acceptor element or a donor element; therefore, the contact resistance between the source and drain regions and a semiconductor region can be reduced. As a result, it is possible to manufacture a display device having a light emitting element that requires high speed operation.

In addition, since metal elements that have been mixed in the semiconductor film in a deposition step are removed in a gettering step, off current can be reduced, and a TFT having an ON/OFF ratio of, typically, six orders of magnitude or more can be formed. When such a TFT is used for a switching element of a display device, contrast can be increased.

Although the connecting terminal portion and the pixel portion are described in this embodiment, a TFT of a driver circuit may be formed at the same time as the TFT of the pixel portion. In this case, the connecting terminal portion, the pixel portion and the driver circuit portion can be formed over the same substrate.

Figure 13:
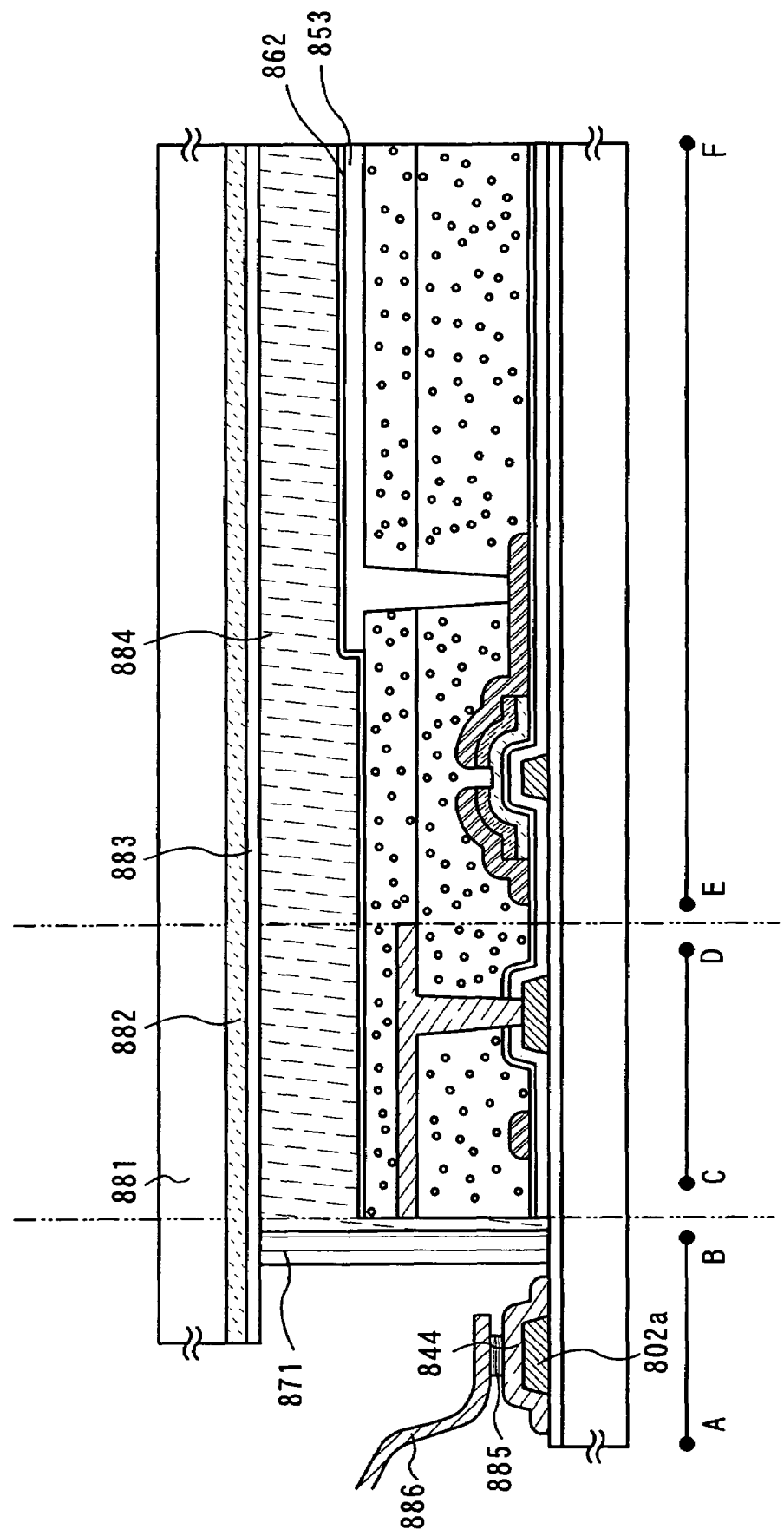
FIG. 13 is a cross sectional view showing a manufacturing step of a semiconductor device in accordance with the invention.
Figure 14:
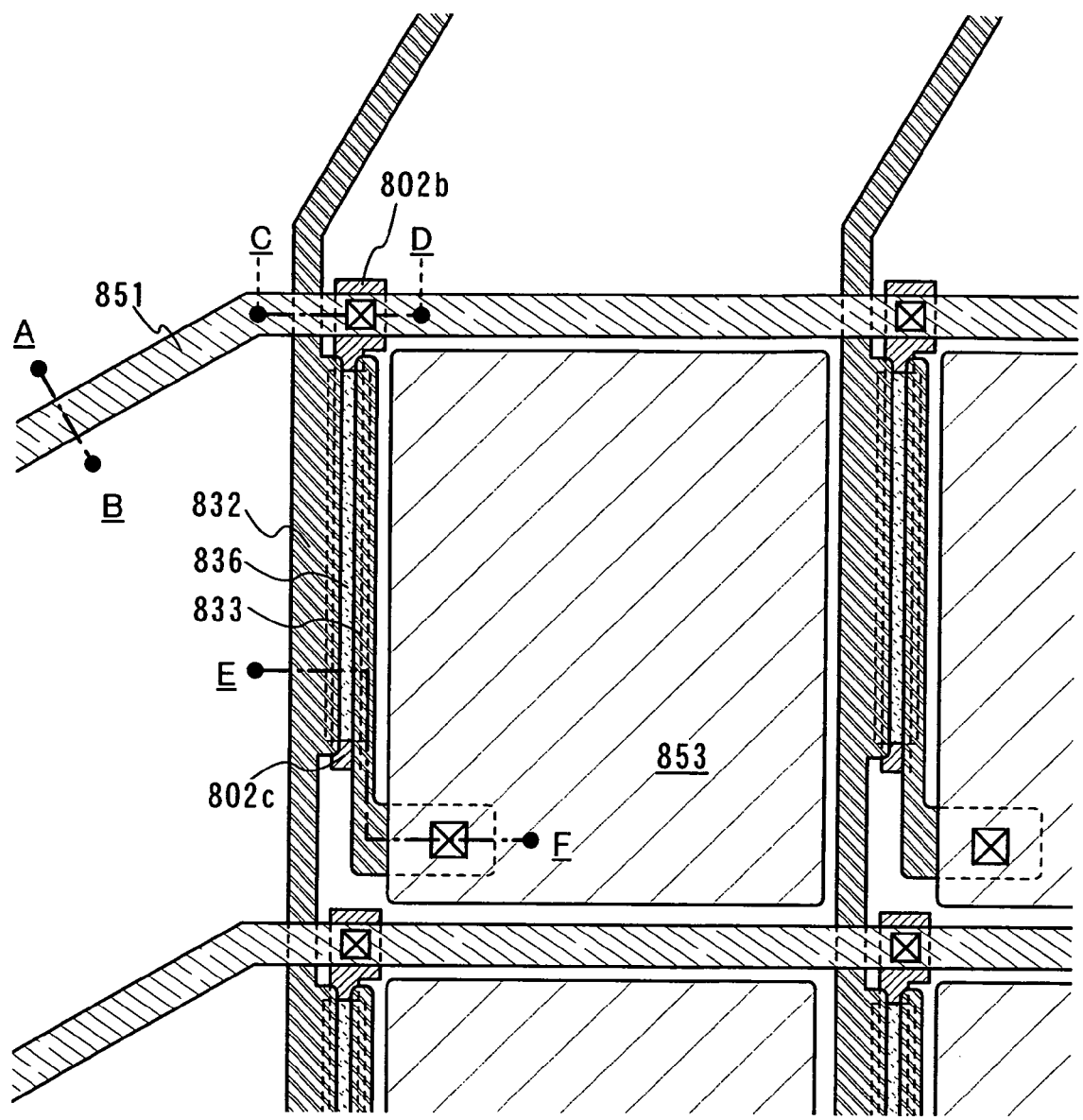
FIG. 14 is a plan view showing a manufacturing step of a semiconductor device in accordance with the invention.

Next, as shown in FIG. 13, an insulating film is formed by printing or spin coating, and rubbing is performed to form an alignment film 862. Note that the alignment film 862 may be formed by oblique evaporation.

An opposite substrate 881 provided with an alignment film 883 and a second pixel electrode (opposite electrode) 882 is prepared. A closed loop sealing member 871 is formed at the periphery of the pixel portion by a droplet discharge method.

Filler may be mixed in the sealing member 871, and the opposite substrate 881 may further be provided with a color filter, a shielding film (black matrix) and the like.

A liquid crystal material is discharged into the closed loop of the sealing member 871 by a dispenser method. Then, in vacuum, the active matrix substrate is attached to the opposite substrate 881 provided with the alignment film 883 and the second pixel electrode (opposite electrode) 882. Subsequently, ultraviolet curing is performed to form a liquid crystal layer 884 filled with the liquid crystal material. Note that the liquid crystal layer 884 may be formed by a dipping method instead of the dispenser method, where the liquid crystal material is injected using a capillary phenomenon after attaching the opposite substrate.

If an insulating film is formed over each end of the third conductive film 844 and a source wire layer (not shown), the insulating film is removed and then the connecting terminal is attached to a wiring board, typically, an FPC (Flexible Printed Circuit) (wiring board 886 connected to the third conductive film functioning as a scan line) through a connecting conductive film 885. Further, the connecting portion between the wiring board and the connecting terminal is preferably sealed with a sealing resin. This structure prevents the pixel portion from degrading due to moisture entering from the cross section.

Through the aforementioned steps, the liquid crystal display panel can be completed. In order to prevent electrostatic discharge damage, a protection circuit, typically a diode or the like may be provided between the connecting terminal and the source wire (gate wire) or in the pixel portion. In that case, electrostatic discharge damage can be prevented when a diode is manufactured by the same steps as the aforementioned TFT and a drain or source wire layer of the diode is connected to the gate wire layer of the pixel portion.

Any of Embodiment Modes 1 and 2 can be applied to this embodiment.

Embodiment 2

Manufacturing steps of an active matrix substrate and a display device having it are described with reference to FIGS. 16A to 16D, FIGS. 17A to 17C, FIGS. 18A to 18C, FIGS. 19A and 19B, and FIG. 20. FIG. 20 is a plan view of a pixel portion. FIGS. 16A to 16D, FIGS. 17A to 17C, FIGS. 18A to 18C, and FIGS. 19A and 19B are longitudinal sectional views of an active matrix substrate, which schematically show a connecting portion A-A' between a gate electrode of a switching TFT and a scan line, a switching TFT B-B', and a driving TFT C-C' of FIG. 20.

As shown in FIG. 16A, a first conductive film with a thickness of 100 to 200 nm is formed over a substrate 900. In this embodiment, a glass substrate is used for the substrate 900 and a tungsten film with a thickness of 150 nm is formed over the surface thereof by sputtering as the first conductive film. Then, a photosensitive material is discharged or applied over the first conductive film, and exposed and developed using a laser beam direct writing system, thereby a first mask is formed. The first conductive film is etched using the first mask to form first conductive films 901 to 903. In this embodiment, a tungsten film is etched by dry etching to form the first conductive films 901 to 903. Note that the first conductive film 901 functions as a gate wire, the first conductive film 902 functions as a gate electrode of a switching TFT, and the first conductive film 903 functions as a gate electrode of a driving TFT.

A first insulating film is formed over the surface of the substrate 900 and the first conductive films 901 to 903. In this embodiment, the first insulating film is obtained by stacking a silicon nitride film 905 with a thickness of 50 to 100 nm and a silicon oxynitride film (SiON, O>N) 906 with a thickness of 50 to 100 nm by CVD. The first insulating film functions as a gate insulating film. At this time, it is preferable that the silicon nitride film and the silicon oxynitride film be continuously formed only by changing a material gas without being exposed to the atmosphere.

An amorphous semiconductor film 907 with a thickness of 10 to 100 nm is formed over the first insulating film. In this embodiment, an amorphous silicon film with a thickness of 100 nm is formed by CVD. Then, the surface of the amorphous semiconductor film 907 is coated with a solution 908 containing a catalytic element. In this embodiment, a solution containing a nickel catalyst of 20 to 30 ppm is applied by spin coating. Subsequently, the amorphous semiconductor film 907 is heated to form a crystalline semiconductor film 911 as shown in FIG. 16B. Note that the crystalline semiconductor film 911 contains a catalytic element. Herein, a crystalline silicon film containing nickel is formed by the same steps as those shown in Embodiment 1. After that, a channel doping step is performed entirely or selectively so that a P-type or N-type impurity element is added at a low concentration to a region that is to be a channel region of a TFr later.

A semiconductor film 912 with a thickness of 100 nm containing a donor element is formed over the surface of the crystalline semiconductor film 911 containing a catalytic element. In this embodiment, an amorphous silicon film containing phosphorus is formed using silane gas and 0.5% phosphine gas (flow rate, silane:phosphine=10:17).

The crystalline semiconductor film 911 and the semiconductor film 912 containing a donor element are heated for gettering the catalytic element and activating the donor element. That is to say, the catalytic element in the crystalline semiconductor film 911 is moved to the semiconductor film 912 containing a donor element. Reference numeral 913 in FIG. 16C denotes a crystalline semiconductor film with a reduced concentration of the catalytic element, which is a crystalline silicon film herein. In addition, the semiconductor film containing a donor element, to which the catalytic element is moved, becomes a crystalline semiconductor film by heating, namely, a crystalline semiconductor film containing a catalytic element and a donor element. Such a crystalline semiconductor film is denoted as 914 in FIG. 16C, which is a crystalline silicon film containing nickel and phosphorus herein.

After second masks 916 and 917 are formed over the crystalline semiconductor film 914 containing a catalytic element and a donor element and the crystalline semiconductor film 913 as shown in FIG. 16D, the crystalline semiconductor films 914 and 913 are etched to be a desired shape using the second masks. The second masks 916 and 917 may be formed by discharging an organic resin by a droplet discharge method and drying it. Alternatively, the second masks 916 and 917 may be formed by exposing and developing a photosensitive material using a laser beam direct writing system similarly to the first mask. In this embodiment, polyimide is selectively discharged by a droplet discharge method, then dried and baked to form the second masks. The etched crystalline semiconductor film 914 containing a catalytic element and a donor element becomes first semiconductor regions 925 and 926 shown in FIG. 17A, while the etched crystalline semiconductor film 913 becomes second semiconductor regions 922 and 923.

A third mask 927 is formed in a region to be an N-channel TFT later. In this embodiment, polyimide is discharged by a droplet discharge method and dried to form the third mask 927 covering the second semiconductor region 922 and the first semiconductor region 925 that are to be an N-channel TFT later.

Figures 17A, 17B, 17C:
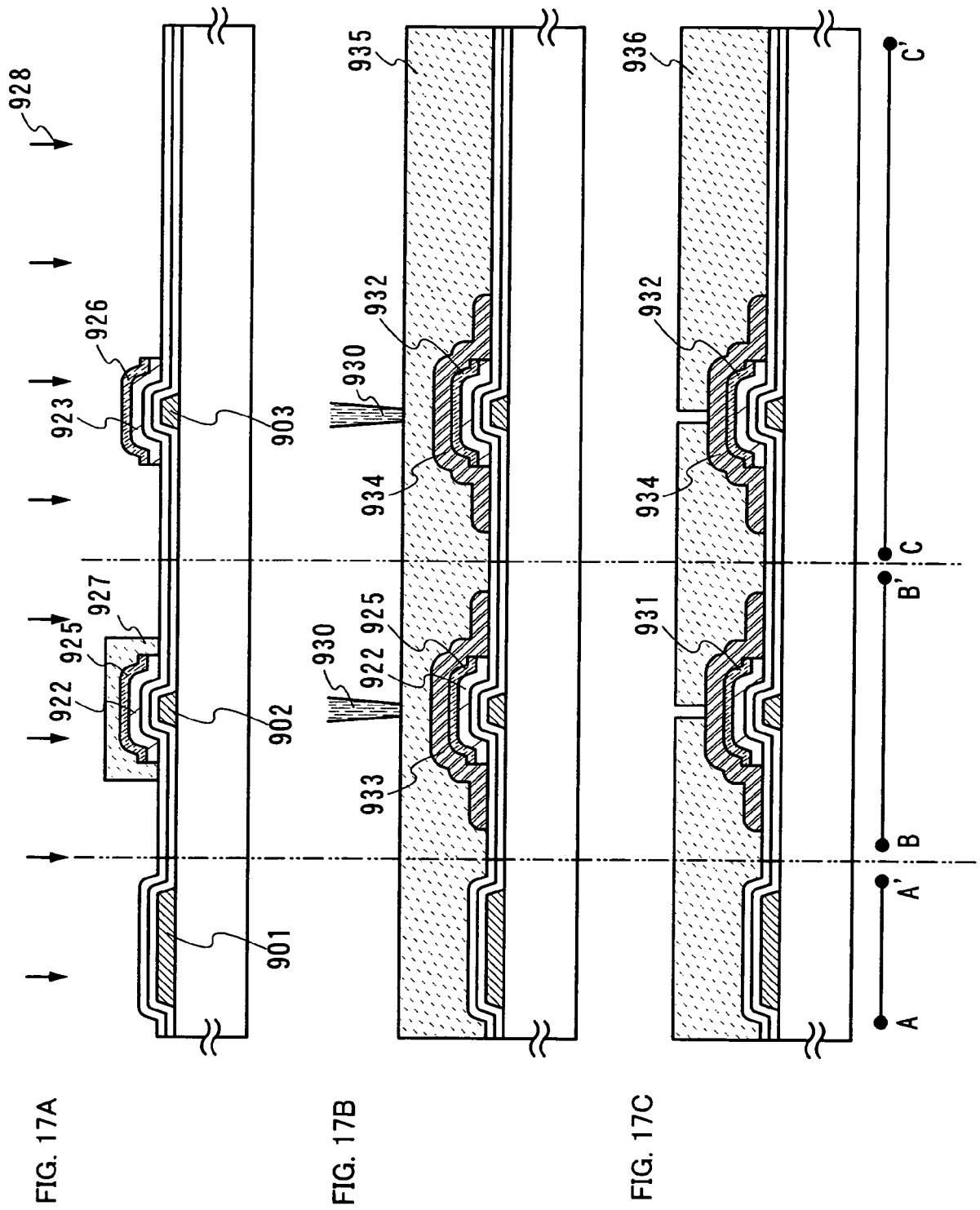
FIGS. 17A to 17C are cross sectional views showing manufacturing steps of a semiconductor device in accordance with the invention.

An acceptor element 928 is added to the first semiconductor region 926 that is to be a P-channel TFT later, thereby a P-type semiconductor region 932 is formed as shown in FIG. 17B.

Although not shown, the first insulting film formed over the first conductive film 903 functioning as a gate electrode of a driving TFT is partially etched to expose a part of the first conductive film 903.

Second conductive films 933 and 934 each having a thickness of 500 to 1000 nm are formed over the first semiconductor region 925, the P-type semiconductor region 932, and the second semiconductor regions 922 and 923. In this embodiment, an Ag paste is discharged by a droplet discharge method, and baked to form a third conductive film.

A photosensitive material 935 is applied or discharged, and irradiated with laser beams 930 using a laser beam direct writing system to be exposed and developed, thereby a fourth mask 936 is formed as shown in FIG. 17C.

As shown in FIG. 18A, the third conductive film is etched using the fourth mask 936 to form fourth conductive films 942 to 945 functioning as a signal line, a scan line, a power supply line, and a source or drain electrode.

Reference is also made to FIG. 20 that is a top plan view of A-A', B-B' and C-C' of the pixel. Through the aforementioned steps, a fourth conductive film 950 functioning as a signal line and the fourth conductive film 943 functioning as a drain electrode are formed over a source or drain region of a switching TFT formed later. Also, a fourth conductive film 951 functioning as a power supply line and a fourth conductive film 952 functioning as a drain electrode are formed over a source or drain region of a driving TFT formed later.

The fourth conductive film 943 functioning as the drain electrode of the switching TFT is connected to the first conductive film 902 functioning as the gate electrode of the driving TFT through a contact hole 909.

In these steps, the third conductive film is separated to form each signal line, power supply line, scan line, and drain electrode, and etching is performed so as to reduce the width of the drain wire. Accordingly, the aperture ratio of a display device formed later can be increased.

Subsequently, the first semiconductor region 925 and the P-type semiconductor region 932 are etched without removing the fourth mask, thereby source and drain regions 949 to 952 are formed. At this time, the second semiconductor regions 922 and 923 are partially etched. The etched semiconductor regions are denoted as third semiconductor regions 955 and 956. The third semiconductor regions 955 and 956 function as channel forming regions.

After removing the fourth mask, a second insulating film 957 and a third insulating film 958 are formed over the fourth conductive films and the third semiconductor regions. In this embodiment, a silicon oxynitride (SiON, O>N) film with a thickness of 150 nm containing hydrogen is formed by CVD as the second insulating film, while a silicon nitride film with a thickness of 200 nm is formed by CVD as the third insulating film. The silicon nitride film functions as a protective film for preventing impurities from entering.

The third semiconductor regions 955 and 956 are heated and hydrogenated. Hydrogen contained in the third insulating film 958 is added to the third semiconductor regions 955 and 956 by heat treatment at a temperature of 410° C. for one hour in a nitrogen atmosphere, so that hydrogenation is performed.

As shown in FIG. 18B, a porous fourth insulating film 971 is formed over the third insulating film 958. In this embodiment, an insulating film is formed by applying siloxane and baking, and then is irradiated with a laser beam emitted from an fs laser oscillator to form a plurality of pores, thereby the porous fourth insulating film 971 is obtained. Subsequently, a fifth mask is formed over the fourth insulating film 971, and the fourth insulating film 971, the third insulating film 958, and the second insulating film 957 are etched to expose a part of the first conductive film 901 functioning as the gate electrode of the switching TFT. Then, a fifth conductive film 972 functioning as a scan line connected to the first conductive film 901 is formed. In this embodiment, an Ag paste is discharged by a droplet discharge method and baked, and the Ag paste is partially etched using a mask formed by a laser beam direct writing system so as to reduce the width of the wire, thereby the fifth conductive film 972 is formed.

Through the aforementioned steps, the pixel portion can be formed, which includes the driving TFT constituted by a P-channel TFT 863 and the switching TFT constituted by an N-channel TFT 962. Note that the driving TFT may be constituted by an N-channel TFT.

After that, a porous fifth insulating film 973 is formed. The fifth insulating film 973 may be formed using the same material as the fourth insulating film. After a sixth mask is formed over the fifth insulating film 973, the second to fifth insulating films are etched to expose a part of the fourth conductive film 952.

Figure 19A:
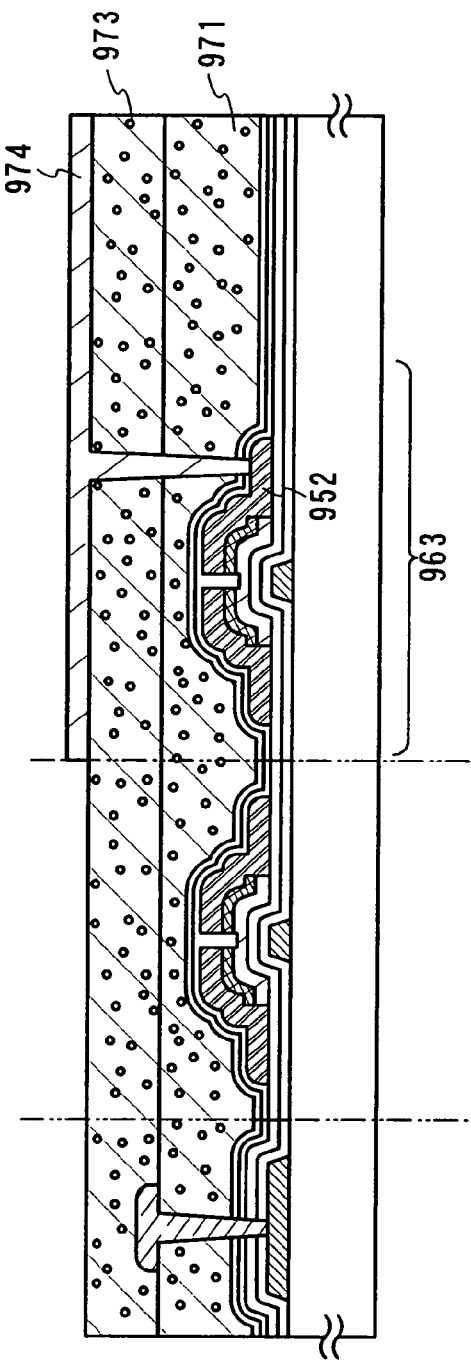
FIGS. 19A and 19B are cross sectional views showing manufacturing steps of a semiconductor device in accordance with the invention.
Figure 20:
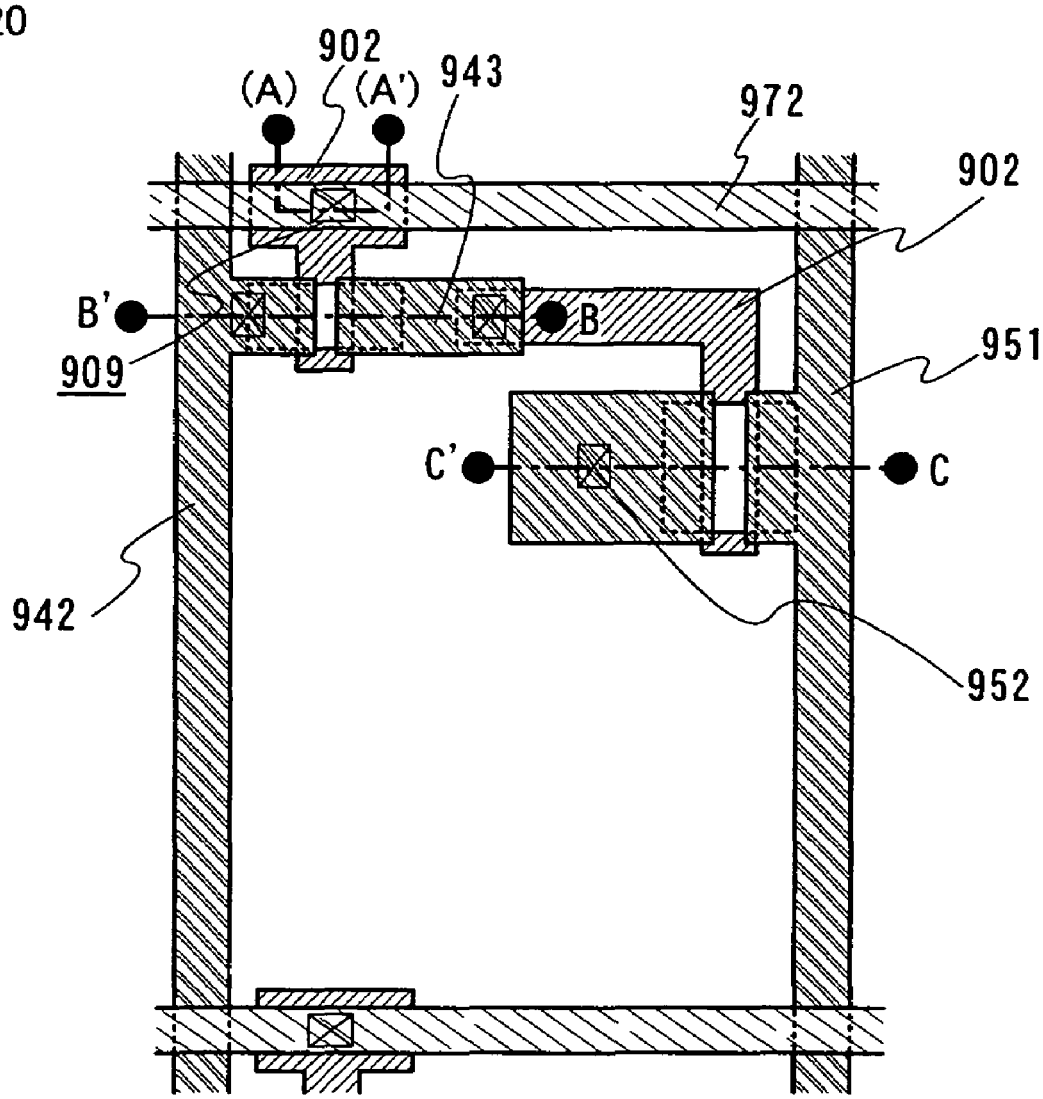
FIG. 20 is a plan view a showing manufacturing step of a semiconductor device in accordance with the invention.

As shown in FIG. 19A, a sixth conductive film with a thickness of 100 to 300 nm is formed so as to be in contact with the fourth conductive film 952. The sixth conductive film 974 may be formed using a light transmissive conductive material or a light reflective conductive material by a droplet discharge method, coating, sputtering, vapor deposition, CVD or the like. If the coating, sputtering, vapor deposition, CVD or the like is adopted, after a mask is formed by a droplet discharge method, or by exposure using a laser beam direct writing system, the conductive film is etched to form the conductive film 974. In this embodiment, an alloy material that mainly contains aluminum with high reflectivity and contains at least one of nickel, cobalt, iron, carbon, and silicon is used for the base layer, and indium tin oxide (ITO) containing silicon oxide is formed thereon by sputtering, then these layers are etched to be a desired shape to form the sixth conductive film 974 functioning as a pixel electrode.

Through the aforementioned steps, the active matrix substrate can be completed. In order to prevent electrostatic discharge damage, a protection circuit, typically a diode or the like may be provided between the connecting terminal and the source wire (scan line) or in the pixel portion. In that case, electrostatic discharge damage can be prevented when a diode is manufactured by the same steps as the aforementioned TFT and a drain or source wire layer of the diode is connected to the scan line layer of the pixel portion.

Figure 19B:
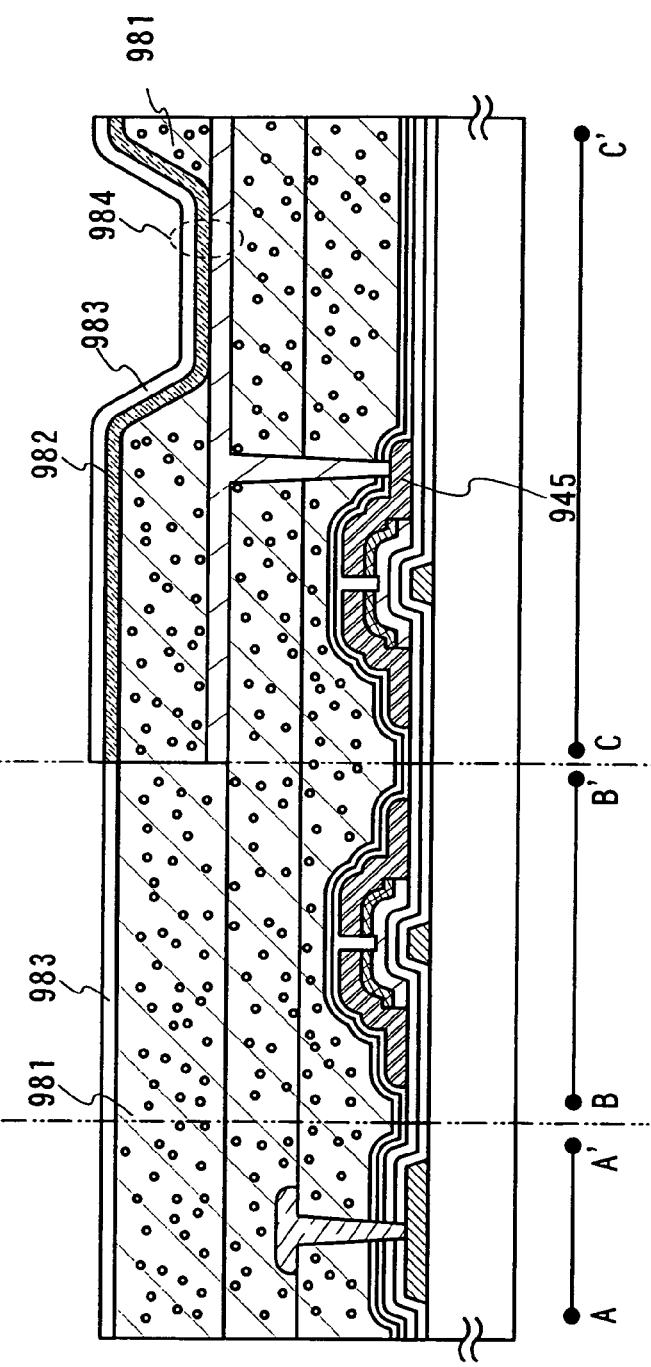

As shown in FIG. 19B, a sixth insulating film 981 is formed covering the end portion of the sixth conductive film 974. In this embodiment, a negative photosensitive material is used to form the sixth insulating film 981.

A layer 982 containing a light emitting substance is formed over the surface of the sixth conductive film 974 and the end portion of the sixth insulating film 981. Then, a seventh conductive film 983 functioning as a second pixel electrode is formed over the layer 982 containing a light emitting substance. In this embodiment, ITO containing silicon oxide is formed by sputtering. As a result, a light emitting element 984 can be constituted by the sixth conductive film, the layer containing a light emitting substance, and the seventh conductive film. The respective materials of the conductive films and the layer containing a light emitting substance that constitute the light emitting element are appropriately selected and each film thickness is also adjusted.

Before forming the layer 982 containing a light emitting substance, heat treatment is performed under atmospheric pressure at a temperature of 200 to 350° C. to remove moisture contained in or absorbed on the surface of the sixth insulating film 981. It is also preferable that heat treatment be performed under reduced pressure at a temperature of 200 to 400° C., preferably at a temperature of 250 to 350° C., and the layer 982 containing a light emitting substance be formed, without being exposed to the atmosphere, by vacuum vapor deposition, a droplet discharge method under atmospheric pressure or reduced pressure, or coating.

The layer 982 containing a light emitting substance is formed using a charge injection/transport substance containing an organic compound or an inorganic compound and a light emitting material. The organic compound includes one or more layers of a low molecular weight organic compound, a medium molecular weight organic compound typified by dendrimer and oligomer, and a high molecular weight organic compound, depending on the number of molecules. The organic compound may be combined with an inorganic compound with electron injection/transport properties or hole injection/transport properties.

As a substance having high electron transport properties among charge injection/transport substances, for example, a metal complex having a quinoline skeleton or a benzoquinoline skeleton can be given, such as tris(8-quinolinolato)aluminum (abbreviation: $Alq_3$), tris(5-methyl-8-quinolinolato) aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolato-aluminum (abbreviation: BAlq).

As a substance having high hole transport properties, for example, an aromatic amine based compound (namely, a compound having the bond of benzene ring-nitrogen) can be given, such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris (N,N-diphenyl-amino)-triphenylamine (abbreviation: TDATA), and 4,4',4"-tris[N-(3-methylphenyl)-N-phenyl-amino]-triphenylamine (abbreviation: MTDATA).

As a substance having high electron injection properties among charge injection/transport substances, a compound of an alkali metal or an alkaline earth metal can be given, such as lithium fluoride (LiF), cesium fluoride (CsF), and calcium fluoride ($CaF_2$). In addition, a mixture of a substance having high electron transport properties, such as $Alq_3$, and an alkaline earth metal such as magnesium (Mg).

As a substance having high hole injection properties among charge injection/transport substances, for example, a metal oxide can be given, such as molybdenum oxide ($MoO_x$), vanadium oxide ($VO_x$), a ruthenium oxide ($RuO_x$), tungsten oxide ($WO_x$), and manganese oxide ($MnO_x$). In addition, a phthalocyanine based compound can be given, such as phthalocyanine (abbreviation: $H_2Pc$) and copper phthalocyanine (CuPc).

The light emitting layer may have a structure to perform color display by providing each pixel with light emitting layers having different emission wavelength ranges. Typically, a light emitting layer corresponding to each color of R (red), G (green), and B (blue) is formed. In this case, color purity can be improved and a pixel portion can be prevented from having a mirror surface (glare) by providing the light emitting side of the pixel with a filter (color layer) that transmits light of an emission wavelength band. By providing a filter (color layer), a circular polarizer or the like that is conventionally required can be omitted, and the loss of light emitted from the light emitting layer can be eliminated. Further, change in hue, which occurs when a pixel portion (display screen) is obliquely seen, can be reduced.

Various materials can be used for a light emitting material of the light emitting layer. As a low molecular weight organic light emitting material, 4-(dicyanomethylene)-2-methyl-6-[2-(1,1,7,7-tetramethyljulolidine-9-yl)ethenyl]-4H-pyran (abbreviation: DCJT); 4-(dicyanomethylene)-2-tert-butyl-6-[2-(1,1,7,7-tetramethyljulolidine-9-yl)ethenyl)]-4H-pyran (abbreviation: DCJTB); Periflanthene; 2,5-dicyano-1,4-bis[2-(10-methoxy-1,1,7,7-tetramethyljulolidine-9-yl)ethenyl] benzene; N,N'-dimethylquinacridon (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); and the like can be used. Other substances can also be used.

On the other hand, a high molecular weight organic light emitting material is physically stronger than a low molecular weight material and is superior in durability of the element. In addition, a high molecular weight organic light emitting material can be formed by coating; therefore, the element can be relatively easily manufactured. A light emitting element using a high molecular weight organic light emitting material has basically the same structure as that using a low molecular weight organic light emitting material, where an anode, a light emitting layer, and a cathode are stacked in this order. However, when a light emitting layer is formed using a high molecular weight organic light emitting material, it is difficult to form such a stacked structure as in the case of using a low molecular weight organic light emitting material; therefore, a two-layer structure is employed in many cases. Specifically, the light emitting element using a high molecular weight organic light emitting material has a structure where an anode, a hole transporting layer, a light emitting layer, and a cathode are stacked in this order.

An emission color is determined depending on a material forming a light emitting layer, and a light emitting element that gives a desired emission color can thus be obtained by selecting a material of the light emitting layer. As a high molecular weight light emitting material that can be used for forming a light emitting layer, a polyparaphenylene-vinylene based material, a polyparaphenylene based material, a polythiophene based material, and a polyfluorene based material can be given.

As the polyparaphenylene vinylene based light emitting material, a derivative of poly(paraphenylenevinylene) [PPV] can be given, such as poly(2,5-dialkoxy-1,4-phenylenevinylene) [RO—PPV], poly(2-(2'-ethyl-hexoxy)-5-methoxy-1,4-phenylenevinylene) [MEH-PPV], and poly(2-(dialkoxyphenyl)-1,4-phenylenevinylene) [ROPh-PPV]. As the polyparaphenylene based light emitting material, a derivative of polyparaphenylene [PPP] can be given, such as poly(2,5-dialkoxy-1,4-phenylene) [RO—PPP] and poly(2,5-dihexoxy-1,4-phenylene). As the polythiophene based light emitting material, a derivative of polythiophene [PT] can be given, such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly[3-(4-octylphenyl)-2,2 bithiophene] [PTOPT]. As the polyfluorene based light emitting material, a derivative of polyfluorene [PF] can be given, such as poly(9,9-dialkylfluorene) [PDAF] and poly(9,9-dioctylfluorene) [PDOF].

The light emitting layer may be formed to emit a single color or white light. When a white light emitting material is used, color display can be achieved by adopting a structure where a filter (color layer) that transmits light with a specific wavelength is provided on the light emitting side of a pixel.

In order to form a light emitting layer that emits white light, for example, $Alq_3$, $Alq_3$ partially doped with Nile red that is a red light emitting pigment, p-EtTAZ, TPD (aromatic diamine) may be sequentially stacked in this order by vapor deposition. In the case where the light emitting layer is formed by spin coating, the layer after coating is preferably baked by vacuum heating. For example, the entire surface may be coated with an aqueous solution of poly(ethylene dioxythiophene) and poly(styrene sulfonic acid) (PEDOT/PSS) and baked to form a film functioning as a hole injection layer. Then, the entire surface may be coated with a polyvinyl carbazole (PVK) solution doped with a luminescent center pigment (1,1,4,4-tetraphenyl-1,3-butadiene (TPB), 4-dicyanomethylene-2-methyl-6-(p-dimethylamino-styryl)-4H-pyran (DCM1), Nile red, coumarin 6, or the like), and baked to form a film functioning as a light emitting layer.

The light emitting layer may be formed to be a single layer. For example, a 1,3,4-oxadiazole derivative (PBD) having electron transport properties may be dispersed in polyvinyl carbazole (PVK) having hole transport properties. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element shown here that gives white light emission, a light emitting element that gives red light emission, green light emission, or blue light emission can be manufactured by appropriately selecting a material of the light emitting layer.

When a high molecular weight organic light emitting material having hole transport properties is interposed between an anode and a high molecular weight organic light emitting material having light emitting properties, hole injection properties from the anode can be enhanced. In general, the high molecular weight organic light emitting material that is dissolved in water along with an acceptor material is applied by spin coating or the like. In addition, the high molecular weight light emitting material having hole injection properties is insoluble in an organic solvent; therefore, it can be stacked over the aforementioned organic light emitting material having light emitting properties. As the high molecular weight organic light emitting material having hole transport properties, a mixture of PEDOT and camphorsulfonic acid (CSA) that serves as an acceptor material, a mixture of polyaniline [PANI] and polystyrene sulfonic acid [PSS] that serves as an acceptor material, and the like can be given.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is formed of a triplet excitation light emitting material and the rest are formed of a singlet excitation light emitting material. A triplet excitation light emitting material has characteristics that the material has good luminous efficiency and consumes less power to obtain the same luminance. That is to say, when a triplet excitation light emitting material is used for a red pixel, only a small amount of current needs to flow to a light emitting element, and reliability can thus be improved. In order to achieve low power consumption, a pixel emitting red light and a pixel emitting green light may be formed of a triplet excitation light emitting material and a pixel emitting blue light may be formed of a singlet excitation light emitting material. Lower power consumption can be achieved by using a triplet excitation light emitting material for a light emitting element that emits green light having high visibility.

As an example of a triplet excitation light emitting material, a metal complex used as a dopant is known, such as a metal complex having platinum that is a third transition series element as a central metal, and a metal complex having iridium as a central metal. A triplet excitation light emitting material is not limited to these compounds, and it is also possible to use a compound having the aforementioned structure and an element belonging to any of the Groups 8 to 10 of the periodic table as a central metal.

The aforementioned materials for forming the light emitting layer are just examples. A light emitting element may be formed by appropriately stacking functional layers such as a hole injection/transporting layer, a hole transporting layer, an electron injection/transporting layer, an electron transporting layer, a light emitting layer, an electron blocking layer, and a hole blocking layer. Further, a mixed layer or a mixed junction may be formed by combining these layers. The structure of the light emitting layer can be varied. Instead of providing a specific electron injection region or light emitting region, an electrode for this purpose or a dispersed light emitting material may be provided unless such modifications depart from the scope of the invention.

A light emitting element formed of the aforementioned materials emits light when a forward bias voltage is applied thereto. A pixel of a display device formed using a light emitting element can be driven by a simple matrix mode or an active matrix mode. In either case, each pixel emits light when a forward bias voltage is applied thereto in specific timing; however, the pixel is in a non-light emitting state for a certain period. The reliability of a light emitting element can be improved by applying a reverse bias voltage in this non-light emitting period. A light emitting element has a deterioration mode where emission intensity decreases under specific driving conditions and a deterioration mode where a non-light emitting region increases in the pixel and luminance decreases apparently. However, the progress of deterioration can be slowed by alternately applying a forward bias voltage and a reverse bias voltage. Thus, the reliability of a light emitting device can be improved.

Subsequently, a transparent protective layer for preventing moisture from entering is formed covering the light emitting element. The transparent protective layer may be formed using a silicon nitride film, a silicon oxide film, a silicon oxynitride film (SiNO film (N>O) or SiON film (N<O)), a thin film mainly containing carbon (e.g., DLC film or CN film), and the like, which are obtained by sputtering or CVD.

Through the aforementioned steps, the active matrix substrate having a light emitting element can be manufactured. Note that any of Embodiment Modes 1 and 2 can be applied to this embodiment.

Embodiment 3

In this embodiment, mounting of a driver circuit on the display panel shown in the aforementioned embodiments is described with reference to FIGS. 21A to 21C.

Figure 21A:
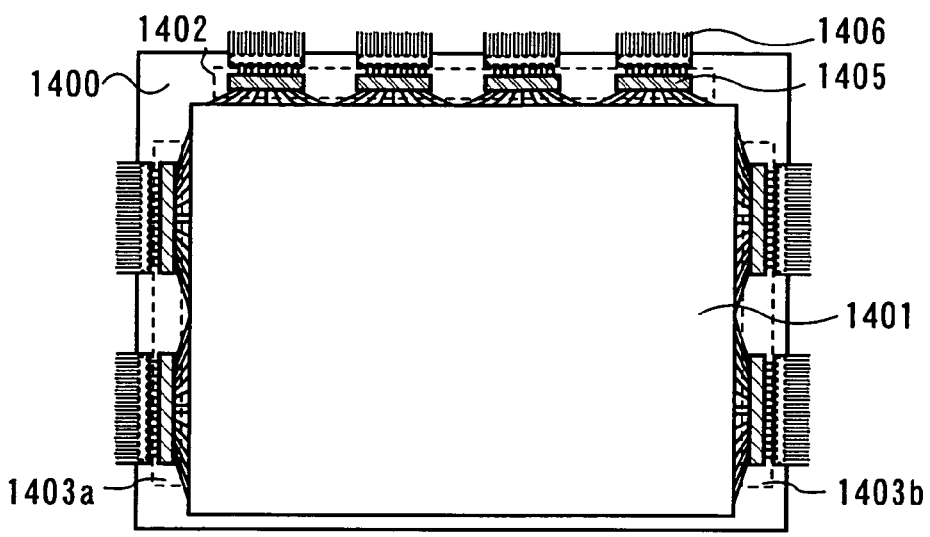
FIGS. 21A to 21C are plan views each showing a mounting method of a driver circuit of a display device in accordance with the invention.

As shown in FIG. 21A, a signal line driver circuit 1402 and scan line driver circuits 1403a and 1403b are mounted on the periphery of a pixel portion 1401. In FIG. 21A, as the signal line driver circuit 1402 and the scan line driver circuits 1403a and 1403b, an IC chip 1405 is mounted on a substrate 1400 by a known mounting method such as a method using an anisotropic conductive adhesive or an anisotropic conductive film, COG, wire bonding, reflow treatment using a solder bump, or the like. In this embodiment, the IC chip 1405 is mounted by COG, and connected to an external circuit through an FPC (Flexible Printed Circuit) 1406.

A part of the signal line driver circuit 1402, for example an analog switch, may be integrated on the substrate and the other part may be separately mounted using an IC chip.

Figure 21B:
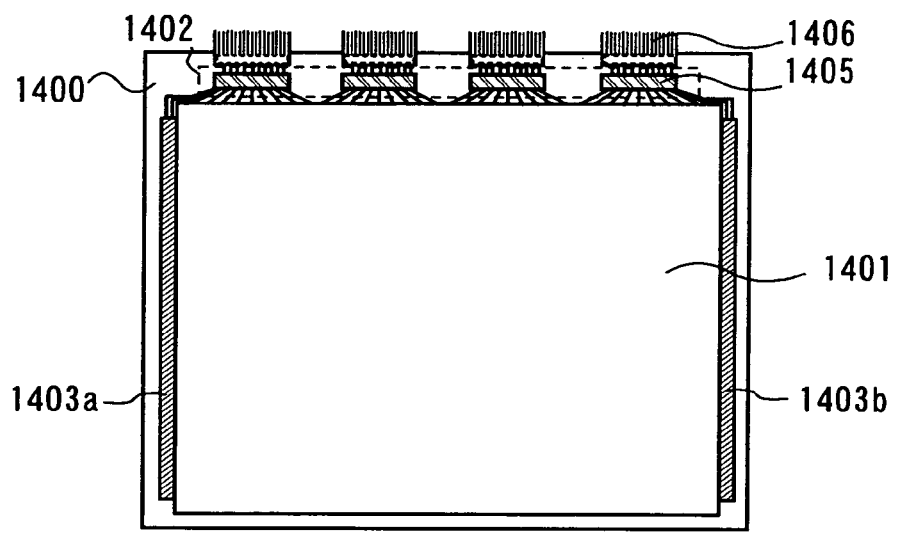

In the case where a TFT is formed of an SAS or a crystalline semiconductor as shown in FIG. 21B, the pixel portion 1401, the scan line driver circuits 1403a and 1403b, and the like may be integrated on the substrate while the signal line driver circuit 1402 and the like may be separately mounted as IC chips. In FIG. 21B, the IC chip 1405 as the signal line driver circuit 1402 is mounted on the substrate 1400 by COG The IC chip 1405 is connected to an external circuit through the FPC 1406.

A part of the signal line driver circuit 1402, for example an analog switch, may be integrated on the substrate and the other part may be separately mounted using an IC chip.

Figure 21C:
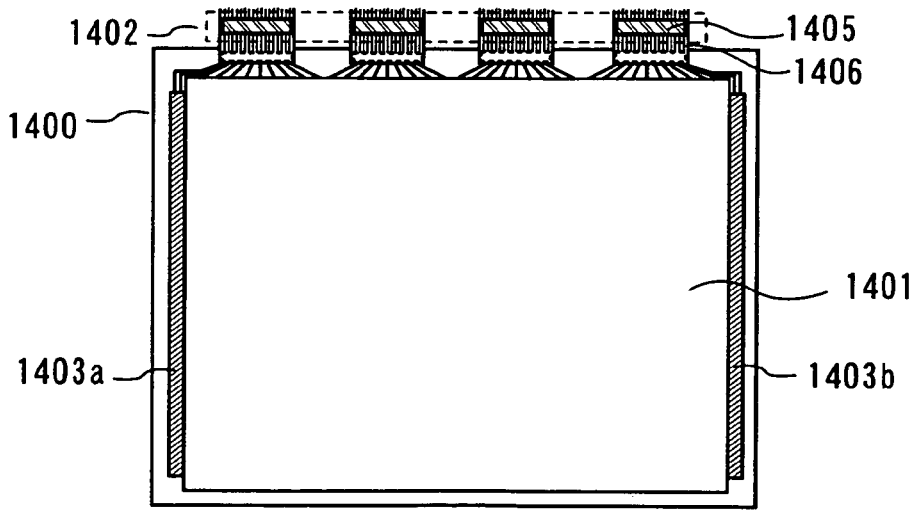

Further, as shown in FIG. 21C, the signal line driver circuit 1402 and the like may be mounted by TAB instead of COG The IC chip is connected to an external circuit through the FPC 1406. Although the signal line driver circuit is mounted 1402 by TAB in FIG. 21C, the scan line driver circuit 1403a, 1403b may be mounted by TAB.

A part of the signal line driver circuit 1402, for example an analog switch, may be integrated on the substrate and the other part may be separately mounted using an IC chip.

When the IC chip is mounted by TAB, the pixel portion can occupy a large area in the substrate, leading to a narrower frame.

Instead of an IC chip formed over a silicon wafer, an IC (hereinafter referred to as a driver IC) formed over a glass substrate may be provided. Since an IC chip is formed over a circular silicon wafer, the shape of a mother substrate is limited. Meanwhile, a driver IC is formed over a glass substrate whose shape is not limited, which results in increased productivity. Accordingly, the shape and size of a driver IC can be determined freely. For example, when forming a driver IC with a long side of 15 to 80 mm, a smaller number of driver ICs are required as compared to the case of mounting IC chips. As a result, the number of connecting terminals can be reduced and productive yield can be increased.

A driver IC can be formed using a crystalline semiconductor formed over a substrate, and the crystalline semiconductor may be formed by irradiating a continuous wave laser beam. A semiconductor film obtained by irradiating a continuous wave laser beam has few crystal defects and large crystal grains. Accordingly, a transistor having such a semiconductor film is improved in mobility and response, capable of operating at high speed, and suitable for a driver IC.

Embodiment 4

Figure 22:
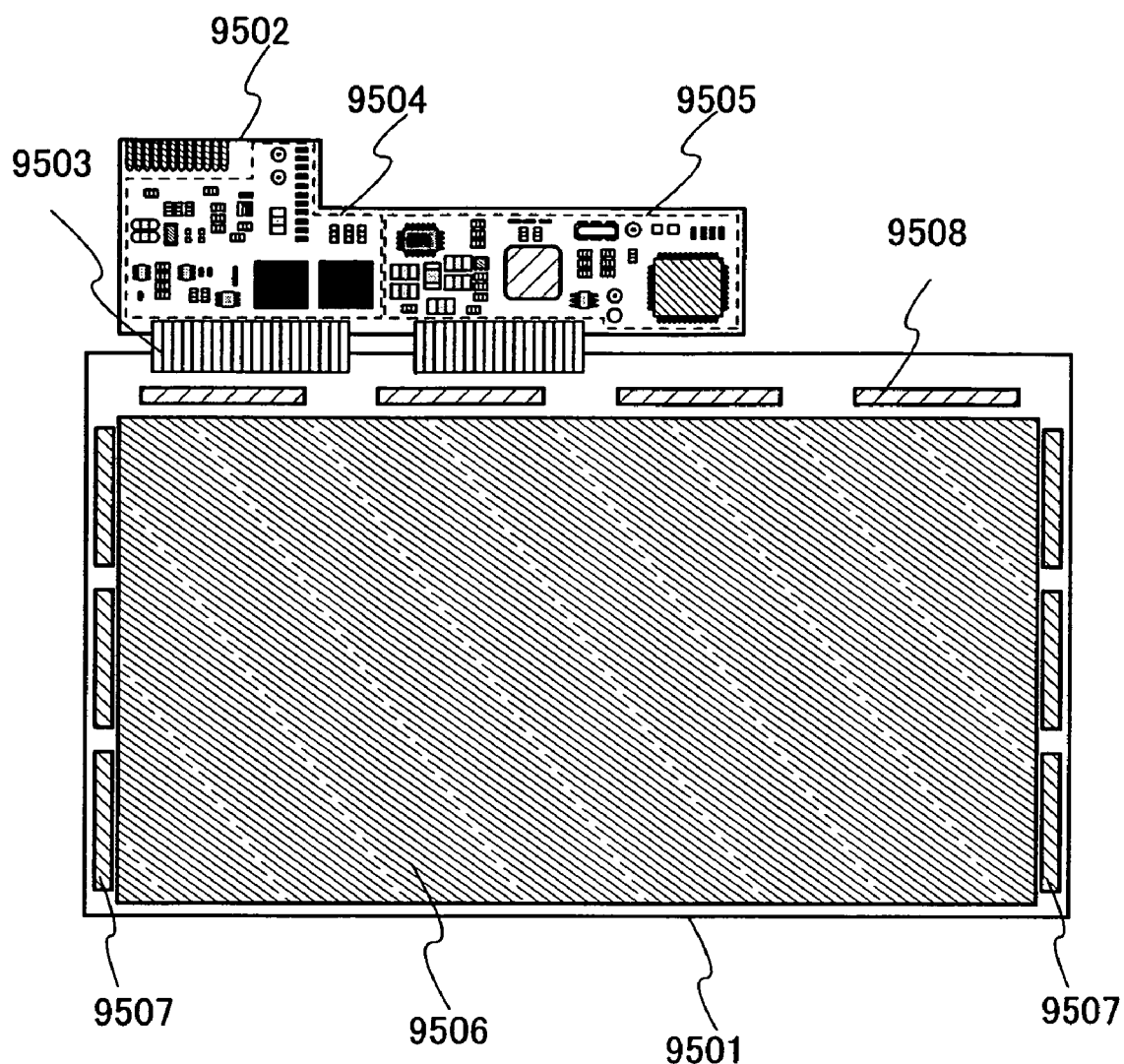
FIG. 22 is a view showing a structure of a light emitting display module in accordance with the invention.

In this embodiment, a module having the display panel shown in the aforementioned embodiments is described with reference to FIG. 22. FIG. 22 shows a module including a display panel 9501 and a circuit board 9502. For example, a control circuit 9504, a signal division circuit 9505 and the like are mounted on the circuit board 9502. The display panel 9501 is connected to the circuit board 9502 through a connecting wire 9503. As the display panel 9501, the liquid crystal panel or the light emitting display panel shown in Embodiment 1 or 2 may be arbitrarily used.

The display panel 9501 has a pixel portion 9506 where a light emitting element is provided in each pixel, a scan line driver circuit 9507, and a signal line driver circuit 9508 that supplies a video signal to a selected pixel. The pixel portion 9506 has the same structure as that shown in Embodiment 1 or 2. As the scan line driver circuit 9507 and the signal line driver circuit 9508, IC chips are mounted on the substrate by a known mounting method such as a method using an anisotropic conductive adhesive or an anisotropic conductive film, COG, wire bonding, reflow treatment using a solder bump, or the like.

This embodiment allows a display module to be provided at low cost.

Embodiment 5

Although a liquid crystal display module and a light emitting display module are shown as an example of the display module in the aforementioned embodiment, the invention is not limited these. The invention may be appropriately applied to other display modules such as a DMD (Digital Micro mirror Device), a PDP (Plasma Display Panel), an FED (Field Emission Display), and an electrophoretic display device (electronic paper).

Embodiment 6

The semiconductor device shown in the aforementioned embodiment modes and embodiments may be applied to electronic apparatuses such as a television set (also simply referred to as a television or a television receiver), cameras such as a digital camera and a digital video camera, a mobile phone unit (also simply referred to as a mobile phone set or a mobile phone), a portable information terminal such as a PDA, a portable game machine, a monitor for a computer, a computer, a sound reproducing device such as a car audio system, and an image reproducing device provided with a recording medium, such as a home game machine. In this embodiment, a specific example of a television set is described with reference to FIGS. 23A and 23B.

Figure 23A:
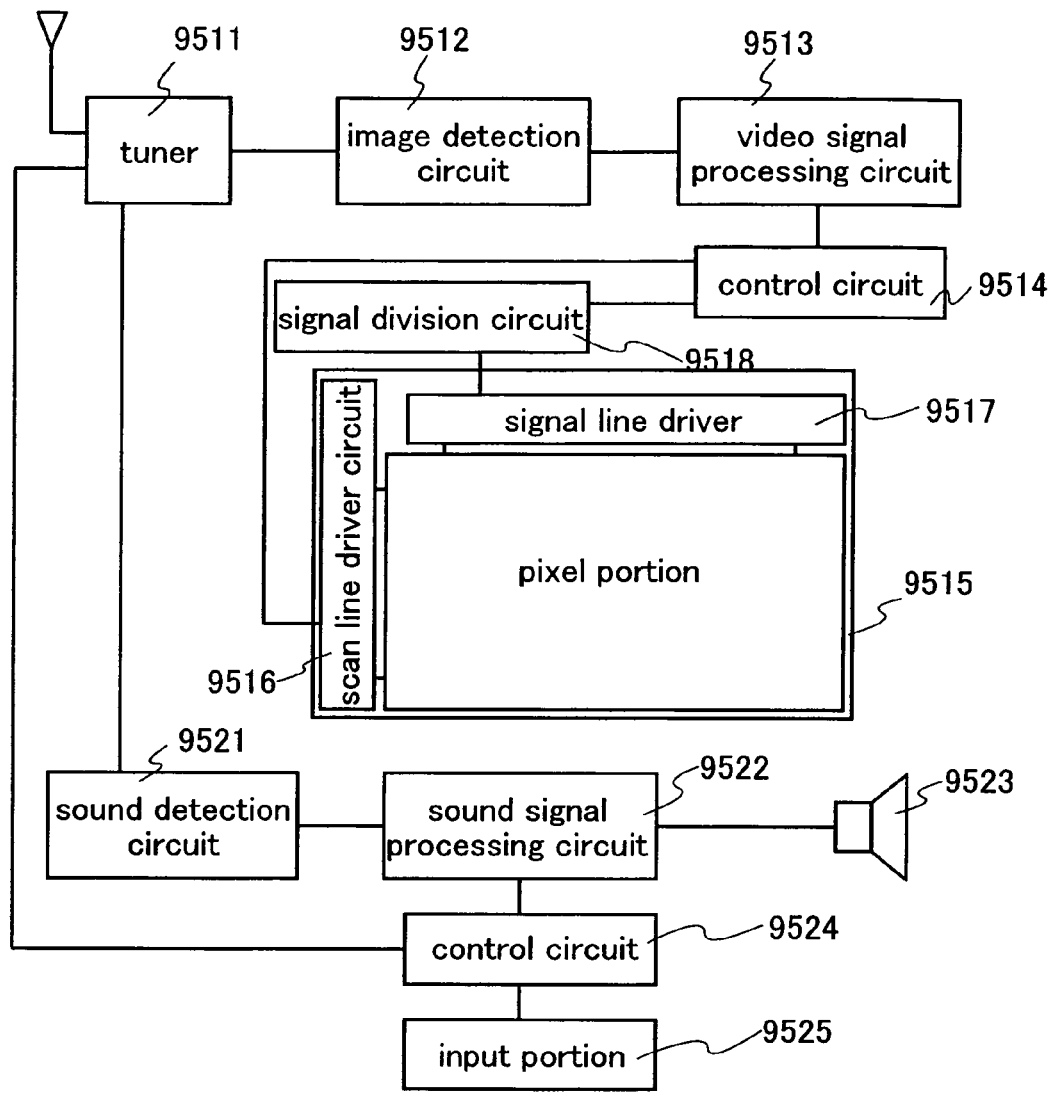
FIGS. 23A and 23B are, respectively, a block diagram and a perspective view showing an example of an electronic apparatus.
Figure 23B:
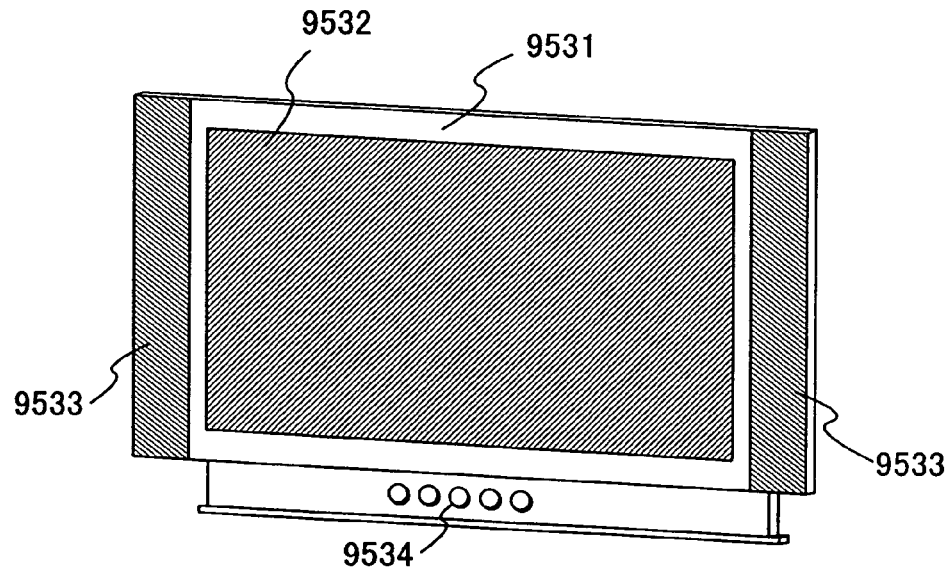

FIG. 23A is a block diagram of a television set, while FIG. 23B is a perspective view of a television set. A liquid crystal television set and an EL television set can be completed using the liquid crystal module and the EL module respectively that are shown in the aforementioned embodiments.

FIG. 23A is a block diagram showing main components of a television set. A tuner 9511 receives a video signal and a sound signal. The video signal is processed by an image detection circuit 9512, a video signal processing circuit 9513 that converts a signal outputted from the image detection circuit into a color signal corresponding to each of red, green and blue, and a control circuit 9514 that converts the video signal in accordance with input specifications of a driver IC. The control circuit 9514 outputs a signal to the scan line driver circuit 9516 and the signal line driver circuit 9517 of the display panel 9515. In the case of digital driving, a signal division circuit 9518 may be provided on the signal line side, so that an inputted digital signal is divided into m signals to be supplied.

Among signals received by the tuner 9511, a sound signal is transmitted to a sound detection circuit 9521, and an output thereof is supplied to a speaker 9523 through a sound signal processing circuit 9522. A control circuit 9524 receives control information of a receiving station (received frequency) and a sound volume from an input portion 9525, and transmits signals to the tuner 9511 and the sound signal processing circuit 9522.

As shown in FIG. 23B, a television set can be completed by incorporating a module in a housing 9531. A display screen 9532 is formed using a module typified by a liquid crystal module and an EL module. The television set also has a speaker 9533, an operating switch 9534 and the like.

Since this television set includes the display panel 9515, cost reduction thereof can be achieved. In addition, the television set with high definition can be provided.

The application of the invention is not limited to the television receiver, and various applications are possible, such as a monitor for a personal computer as well as, in particular, a display medium with a large area such as an information display panel at stations or airports, and an advertisement display panel on the street.

Embodiment 8

Figure 24A:
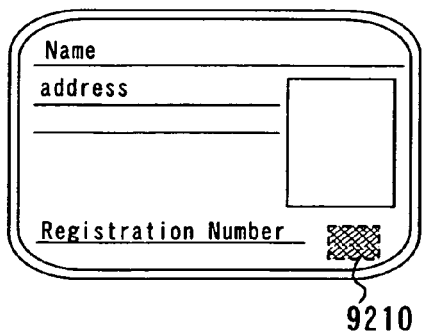
FIGS. 24A to 24F are perspective views showing application examples of a semiconductor device.
Figure 24B:
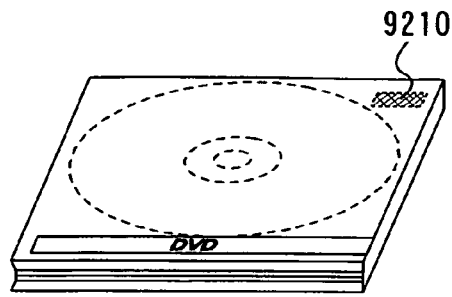
Figure 24C:
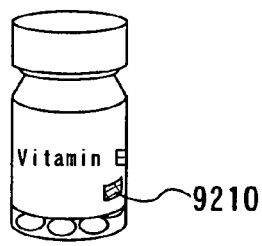
Figure 24D:
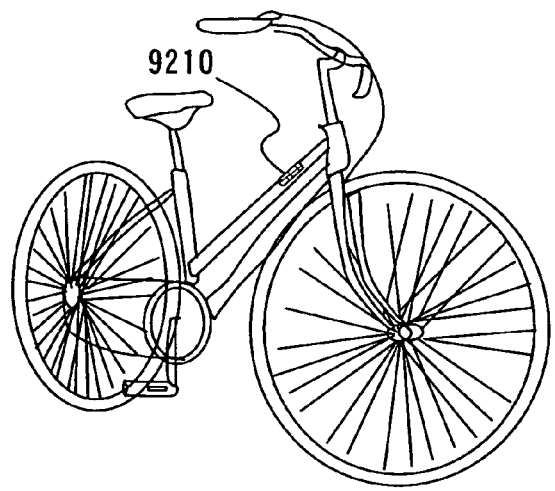
Figure 24E:
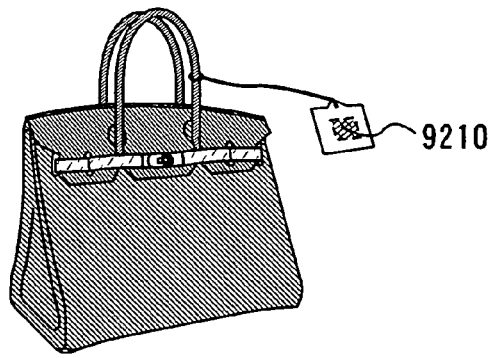
Figure 24F:
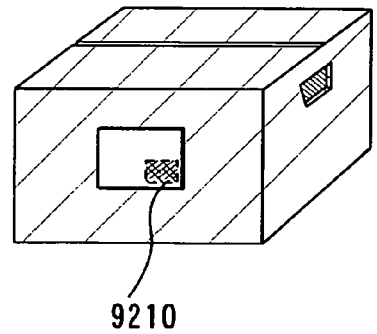

According to the invention, a semiconductor device functioning as a wireless chip (also called a wireless processor, a wireless memory, or a wireless tag). The wireless chip may be mounted on various objects, for example, such as bills, coins, securities, bearer bonds, certificates (licenses, resident cards and the like, see FIG. 24A), containers for wrapping objects (wrapping papers, bottles and the like, see FIG. 24C), recording media (DVDs, video tapes and the like, see FIG. 24B), vehicles (bicycles and the like, see FIG. 24D), belongings (bags, glasses and the like), foods, plants, animals, human body, clothes, livingware, and electronic apparatuses, or shipping tags of objects (see FIGS. 24E and 24F). The electronic apparatuses include liquid crystal display devices, EL display devices, television sets (also simply called televisions or television receivers), mobile phones, and the like.

A wireless chip is attached to the surface of the object or incorporated in the object to be fixed. For example, a wireless chip may be incorporated in a paper of a book, or an organic resin of a package. When a wireless chip is incorporated in bills, coins, securities, bearer bonds, certificates, and the like, forgery thereof can be prevented. In addition, when a wireless chip is incorporated in containers for wrapping objects, recording media, belongings, foods, clothes, livingware, electronic apparatuses, and the like, test systems, rental systems and the like can be performed more efficiently. A wireless chip of the invention is obtained in such a manner that a thin film integrated circuit formed over a substrate is peeled off by a known peeling step and then attached to a cover material; therefore, the wireless chip can be reduced in size, thickness and weight and can be mounted on an object while keeping the attractive design. In addition, since such a wireless chip has flexibility, it can be attached to an object having a curved surface, such as bottles and pipes.

When a wireless chip of the invention is applied to product management and distribution system, high performance system can be achieved. For example, when information stored in a wireless chip mounted on a shipping tag is read by a reader/writer provided beside a conveyor belt, information such as distribution process and delivery address is read to easily inspect and distribute the object.

Figure 15:
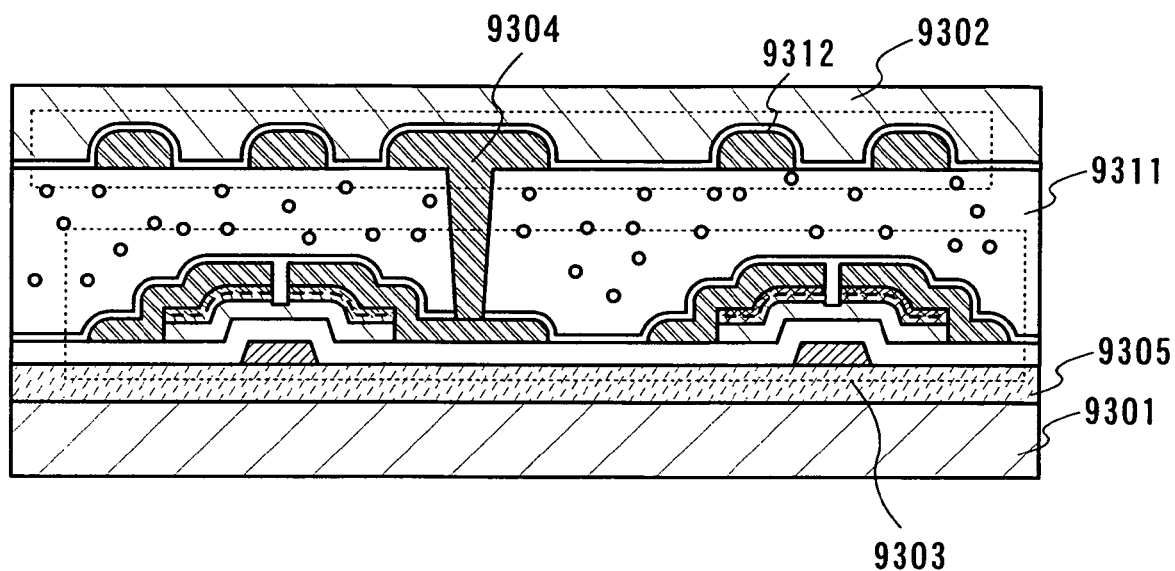
FIG. 15 is a cross sectional view showing a structure of a semiconductor device in accordance with the invention.

A structure of a wireless chip of the invention is described with reference to FIG. 15. A wireless chip is constituted by a thin film integrated circuit 9303 and an antenna 9304 connected thereto. The thin film integrated circuit 9303 and the antenna 9304 are sandwiched between cover materials 9301 and 9302. The thin film integrated circuit 9303 may be attached to the cover materials with an adhesive. In FIG. 15, one surface of the thin film integrated circuit 9303 is attached to the cover material 9301 with an adhesive 9305.

The thin film integrated circuit 9303 is formed using a TFT having an insulating film, which is shown in Embodiment Mode 1 or 2, then peeled off by a known peeling step and attached to a cover material. The semiconductor element used for the thin film integrated circuit 9303 is not limited to this, and in addition to the TFT, a memory element, a diode, a photoelectric converter, a resistor, a coil, a capacitor, an inductor and the like may also be used.

As shown in FIG. 15, an interlayer insulating film 9311 is formed over the TFT of the thin film integrated circuit 9303, and the antenna 9304 is connected to the TFT through the interlayer insulating film 9311. Further, a barrier film 9312 made of silicon nitride or the like is formed over the interlayer insulating film 9311 and the antenna 9304.

The antenna 9304 is formed by discharging a droplet containing a conductor such as gold, silver and copper by a droplet discharge method, then baking and drying it. When the antenna is formed by a droplet discharge method, reduction in the number of steps can be achieved, leading to cost reduction.

Each of the cover materials 9301 and 9302 preferably uses a film (made of polypropylene, polyester, vinyl, polyvinyl fluoride, vinyl chloride, or the like), paper of a fibrous material, a film where a base film (polyester, polyamide, an inorganic vapor deposition film, papers, or the like) and an adhesive synthetic resin film (an acrylic based synthetic resin, an epoxy based synthetic resin, or the like) are stacked, or the like. The film is obtained by performing sealing treatment to the subject by thermocompression. In the sealing treatment, an adhesive layer formed on the upper most surface of the film or a layer (not an adhesive layer) formed on the outermost layer is melted by heat treatment to adhere by applying pressure.

When the cover material uses a flammable pollution-free material such as paper, fiber and carbon graphite, the used wireless chip can be burned or cut out. The wireless chip using such a material is pollution free since it does not generate poison gas even if being burned.

Although the wireless chip is attached to the cover material 9301 with the adhesive 9305 in FIG. 15, the wireless chip may be attached to the object instead of the cover material 9301.

This application is based on Japanese Patent Application Serial No. 2004-347738 filed in Japanese Patent Office on Nov. 30, 2004, the entire contents of which are hereby incorporated by reference.

What is claimed is:

1. A manufacturing method of an insulating film, comprising the steps of:
   forming a first insulating film over a substrate by using one of CVD, plasma CVD, and sputtering method; and
   selectively irradiating the first insulating film with a laser beam condensed by an optical lens to form a pore in the vicinity of a condensed spot,
   wherein a porous insulating film is formed by moving the condensed spot.

2. The manufacturing method of an insulating film, according to claim 1,
   wherein each of the plurality of pores has a diameter of 1 to 2000 nm.

3. The manufacturing method of an insulating film, according to claim 1,
   wherein the first insulating film is formed of a material that transmits the laser beam.

4. The manufacturing method of an insulating film, according to claim 1,
   wherein the laser is an ultrashort pulse laser.

5. The manufacturing method of an insulating film, according to claim 1,
   wherein the porous insulating film has a first region and a second region; and
   wherein the densities of pores of the first region and the second region are different.

6. A manufacturing method of a semiconductor device, comprising the steps of:
   forming a first conductive film over a substrate;
   forming a first insulating film covering the first conductive film;
   selectively irradiating the first insulating film with a first laser beam to form a plurality of pores, whereby a porous insulating film is formed;
   etching a part of the porous insulating film, whereby the first conductive film is exposed and a contact hole is formed;
   discharging a liquid substance containing conductive particles into the contact hole by a droplet discharge method; and
   irradiating a part of the liquid substance containing the conductive particles with a second laser beam, whereby a second conductive film constituted by the conductive particles is formed.

7. The manufacturing method of a semiconductor device, according to claim 6,
   wherein each of the plurality of pores has a diameter of 1 to 2000 nm.

8. The manufacturing method of a semiconductor device, according to claim 6,
   wherein the first insulating film is formed of a material that transmits the laser beam.

9. The manufacturing method of a semiconductor device, according to claim 6,
   wherein the second conductive film is formed of the conductive particles that irregularly overlap.

10. The manufacturing method of an insulating film, according to any one of claim 6,
    wherein the laser is an ultrashort pulse laser.

11. The manufacturing method of an insulating film, according to claim 6,
    wherein the porous insulating film has a first region and a second region; and
    wherein the densities of pores of the first region and the second region are different.

12. A manufacturing method of a semiconductor device, comprising the steps of:
    forming a first conductive film over a substrate;
    forming a first insulating film covering the first conductive film;
    etching a part of the first insulating film, whereby the first conductive film is exposed and a contact hole is formed;

selectively irradiating the first insulating film with a first laser beam to form a plurality of pores, whereby a porous insulating film is formed;

discharging a liquid substance containing conductive particles into the contact hole by a droplet discharge method; and irradiating a part of the liquid substance containing the conductive particles with a second laser beam, whereby a second conductive film constituted by the conductive particles is formed.

13. The manufacturing method of a semiconductor device, according to claim 12, wherein after a plurality of pores are formed in the first insulating film to form a porous insulating film, a third conductive film is formed on a sidewall of the contact hole.

14. The manufacturing method of a semiconductor device, according to claim 13, wherein the third conductive film is a barrier film.

15. The manufacturing method of a semiconductor device, according to claim 12, wherein each of the plurality of pores has a diameter of 1 to 2000 nm.

16. The manufacturing method of a semiconductor device, according to claim 12, wherein the first insulating film is formed of a material that transmits the laser beam.

17. The manufacturing method of a semiconductor device, according to claim 12, wherein the second conductive film is formed of the conductive particles that irregularly overlap.

18. The manufacturing method of an insulating film, according to claim 12, wherein the laser is an ultrashort pulse laser.

19. The manufacturing method of an insulating film, according to claim 12, wherein the porous insulating film has a first region and a second region; and wherein the densities of pores of the first region and the second region are different.

* * * * *